US009069421B2

(12) United States Patent
Liu

(10) Patent No.: US 9,069,421 B2
(45) Date of Patent: Jun. 30, 2015

(54) TOUCH SENSOR AND TOUCH DISPLAY APPARATUS AND DRIVING METHOD THEREOF

(76) Inventor: Hung-Ta Liu, Zhubei (TW)

( * ) Notice: Subject to any disclaimer, the term of this patent is extended or adjusted under 35 U.S.C. 154(b) by 528 days.

(21) Appl. No.: 13/354,147

(22) Filed: Jan. 19, 2012

(65) Prior Publication Data
US 2012/0154327 A1 Jun. 21, 2012

Related U.S. Application Data

(63) Continuation-in-part of application No. 13/328,067, filed on Dec. 16, 2011, now Pat. No. 8,933,897.

(30) Foreign Application Priority Data

Feb. 1, 2011 (TW) .............................. 100103923 A

(51) Int. Cl.
G06F 3/044 (2006.01)
G06F 3/046 (2006.01)
G06F 3/041 (2006.01)
G06F 3/042 (2006.01)
H01L 27/146 (2006.01)

(52) U.S. Cl.
CPC .............. G06F 3/044 (2013.01); G06F 3/0412 (2013.01); G06F 3/042 (2013.01); G06F 3/046 (2013.01); H01L 27/14609 (2013.01)

(58) Field of Classification Search
CPC ......... G06F 3/044; G06F 3/046; G06F 3/047; G06F 3/0412; G06F 3/041; G06F 3/042; G06F 3/0416; G06F 2203/04106; H01L 27/14609

USPC ..................... 345/173, 174; 178/18.06, 18.07
See application file for complete search history.

(56) References Cited

U.S. PATENT DOCUMENTS

| 5,606,346 A | 2/1997 | Kai et al. ....................... 345/173 |
| 5,894,304 A | 4/1999 | Hirano ........................... 345/179 |
| 5,905,489 A | 5/1999 | Takahama et al. ............. 345/174 |

(Continued)

FOREIGN PATENT DOCUMENTS

| CN | 1169557 | 1/1998 | .............. G06F 3/033 |
| CN | 1591093 | 3/2005 | .............. G02B 26/00 |

(Continued)

OTHER PUBLICATIONS

Office Action issued in related U.S. Appl. No. 13/475,799, dated Dec. 19, 2013 (26 pgs).

(Continued)

Primary Examiner — Dmitriy Bolotin
(74) Attorney, Agent, or Firm — Hayes Soloway P.C.

(57) ABSTRACT

The present invention provides a dual-mode touch sensing apparatus. The apparatus includes a sensor; a plurality of first conductive line, a first direction selection line, and a first direction transmission line arranged in parallel to each other and in a first direction, wherein the first direction selection line corresponds to the first direction transmission line; and a plurality of second conductive line, a second direction selection line, and a second direction transmission line arranged in parallel to each other and in a second direction, wherein the second conductive lines, the second direction selection line and the second direction transmission line cross the first conductive lines, the first direction selection line and the first direction transmission line.

20 Claims, 11 Drawing Sheets

(56) References Cited

U.S. PATENT DOCUMENTS

| | | | |
|---|---|---|---|
| 6,417,846 B1 | 7/2002 | Lee | 345/173 |
| 6,424,398 B1 | 7/2002 | Taniguchi | 349/143 |
| 7,095,545 B2 | 8/2006 | Regan | 359/290 |
| 7,307,776 B2 | 12/2007 | Tsai et al. | 359/291 |
| 7,679,376 B2 | 3/2010 | Kang et al. | 324/658 |
| 7,742,041 B2 | 6/2010 | Lee et al. | 345/173 |
| 8,243,027 B2 | 8/2012 | Hotelling et al. | 345/173 |
| 8,259,086 B2 | 9/2012 | Agari et al. | 345/173 |
| 8,325,130 B2 | 12/2012 | Nam | 345/107 |
| 8,346,048 B2 | 1/2013 | Bita et al. | 385/146 |
| 8,405,639 B1 | 3/2013 | Fu | 345/175 |
| 8,411,069 B1 | 4/2013 | Huang | 345/175 |
| 8,514,189 B2 | 8/2013 | Wu et al. | 345/173 |
| 8,552,989 B2 | 10/2013 | Hotelling et al. | 345/173 |
| 8,866,751 B2 | 10/2014 | Park et al. | 345/173 |
| 8,933,897 B2 | 1/2015 | Liu | 345/173 |
| 2004/0105040 A1 | 6/2004 | Oh et al. | 349/12 |
| 2004/0217945 A1 | 11/2004 | Miyamoto et al. | 345/173 |
| 2005/0231487 A1 | 10/2005 | Ming | 345/173 |
| 2006/0017710 A1 | 1/2006 | Lee et al. | 345/173 |
| 2006/0066586 A1 | 3/2006 | Gally et al. | 345/173 |
| 2006/0067651 A1 | 3/2006 | Chui | 385/147 |
| 2006/0077122 A1 | 4/2006 | Gally et al. | 345/32 |
| 2006/0238487 A1 | 10/2006 | Shih | 345/102 |
| 2006/0256093 A1 | 11/2006 | Furukawa et al. | 345/173 |
| 2007/0002009 A1 | 1/2007 | Pasch et al. | 345/108 |
| 2007/0285365 A1 | 12/2007 | Lee | 345/87 |
| 2009/0021884 A1 | 1/2009 | Nakamura | 361/233 |
| 2009/0135254 A1 | 5/2009 | Chiang-Lin | 348/169 |
| 2009/0207154 A1 | 8/2009 | Chino | 345/175 |
| 2009/0267905 A1 | 10/2009 | Hsu et al. | 345/173 |
| 2009/0279162 A1 | 11/2009 | Chui | 359/290 |
| 2010/0013788 A1 | 1/2010 | Park et al. | 345/174 |
| 2010/0045630 A1 | 2/2010 | Gu et al. | 345/174 |
| 2010/0045631 A1 | 2/2010 | Chen et al. | 345/174 |
| 2010/0045635 A1 | 2/2010 | Soo | 345/174 |
| 2010/0123673 A1 | 5/2010 | Nam | 345/173 |
| 2010/0214248 A1 | 8/2010 | Takano et al. | 345/173 |
| 2010/0258360 A1 | 10/2010 | Yilmaz | 178/18.06 |
| 2010/0295810 A1 | 11/2010 | Nagata et al. | 345/173 |
| 2010/0295819 A1 | 11/2010 | Ozeki et al. | 345/173 |
| 2010/0328249 A1 | 12/2010 | Ningrat et al. | 345/174 |
| 2010/0328336 A1 | 12/2010 | Si | 345/589 |
| 2011/0007013 A1 | 1/2011 | Shoji | 345/173 |
| 2011/0025635 A1 | 2/2011 | Lee | 345/173 |
| 2011/0096251 A1 | 4/2011 | Son et al. | 345/15 |
| 2011/0109568 A1 | 5/2011 | Wu et al. | 345/173 |
| 2011/0109622 A1 | 5/2011 | Son et al. | 345/419 |
| 2011/0122096 A1 | 5/2011 | Kim et al. | 345/175 |
| 2011/0134067 A1 | 6/2011 | Joguet et al. | 345/173 |
| 2011/0157058 A1 | 6/2011 | Bita et al. | 345/173 |
| 2011/0205178 A1 | 8/2011 | Yoshida et al. | 345/173 |
| 2011/0210927 A1 | 9/2011 | Mizuhashi et al. | 345/173 |
| 2011/0227588 A1 | 9/2011 | Chen et al. | 324/654 |
| 2011/0267295 A1 | 11/2011 | Noguchi et al. | 345/173 |
| 2011/0285640 A1 | 11/2011 | Park et al. | 345/173 |
| 2012/0026414 A1 | 2/2012 | Hsiao et al. | 348/744 |
| 2012/0075216 A1 | 3/2012 | Black et al. | 345/173 |
| 2012/0075240 A1 | 3/2012 | Kida et al. | 345/173 |
| 2012/0092279 A1 | 4/2012 | Martin | 345/173 |
| 2012/0092294 A1 | 4/2012 | Ganapathi et al. | 345/174 |
| 2012/0146936 A1 | 6/2012 | Liu | 345/174 |
| 2012/0154333 A1 | 6/2012 | Gu et al. | 345/174 |
| 2012/0169400 A1 | 7/2012 | Liu | 324/517 |
| 2012/0169629 A1 | 7/2012 | Shih et al. | 345/173 |
| 2012/0319977 A1 | 12/2012 | Kuge | 345/173 |

FOREIGN PATENT DOCUMENTS

| | | | |
|---|---|---|---|
| CN | 101089687 | 12/2007 | G02F 1/333 |
| CN | 101122725 | 2/2008 | G02F 1/133 |
| CN | 101448142 | 6/2009 | H04N 7/18 |
| CN | 101937296 | 1/2011 | G06F 3/044 |
| CN | 102007446 | 4/2011 | G02F 1/1333 |
| EP | 0250931 | 1/1988 | |
| EP | 2172834 | 4/2010 | |
| FR | 2934908 | 2/2010 | G06F 3/02 |
| JP | H07295726 | 11/1995 | G06F 3/03 |
| JP | 3220405 | 10/2001 | |
| TW | 200506480 | 2/2005 | G02F 1/21 |
| TW | 200533591 | 10/2005 | B81B 7/02 |
| TW | 200624974 | 7/2006 | G02F 1/21 |
| TW | 200627041 | 8/2006 | G02F 1/21 |
| TW | CN101019071 | 8/2007 | G02B 5/02 |
| TW | 200939097 | 9/2009 | |
| TW | 201007090 | 2/2010 | B81B 7/02 |
| TW | 201017306 | 5/2010 | G02F 1/21 |
| TW | 201024203 | 7/2010 | B81B 7/02 |
| TW | 201044241 | 12/2010 | G06F 3/041 |
| TW | M393740 | 12/2010 | G06F 3/044 |
| WO | WO2011102038 | 8/2011 | |

OTHER PUBLICATIONS

Taiwanese Office Action (no translation) issued in related application No. 100117825, dated Mar. 17, 2014 (14 pgs).

Taiwanese Office Action (no translation) issued in related application No. 100103923, dated Apr. 25, 2014 (5 pgs).

Chinese Office Action (no translation) issued in related application No. 201210159628.7, dated Jun. 4, 2014 (14 pgs).

Office Action issued in U.S. Appl. No. 13/339,667, dated Aug. 1, 2013 (6 pgs).

Chinese Office Action (no translation) issued in related application No. 2011104338719, dated Oct. 8, 2014 (7 pgs).

Chinese Office Action issued in application No. 201210018369.6, dated Feb. 2, 2015 (10 pg).

Chinese Office Action issued in application No. 201210159628.7, dated Jan. 6, 2015 (13 pgs).

French Preliminary Search Report issued in related application 1161837, dated Dec. 9, 2013 (10 pgs).

Notice of Allowance issued in U.S. Appl. No. 13/328,067, dated Nov. 10, 2014 (6 pgs).

Notice of Allowance issued in U.S. Appl. No. 13/339,667, dated Mar. 6, 2015 (13 pgs).

Notice of Allowance issued in U.S. Appl. No. 13/475,799, dated Nov. 19, 2014 (5 pgs).

Notice of Allowance issued in U.S. Appl. No. 13/628,567, dated Feb. 4, 2015 (10 pgs).

Office Action issued in U.S. Appl. No. 13/328,067, dated Dec. 17, 2013 (28 pgs).

Office Action issued in U.S. Appl. No. 13/328,067, dated Jul. 16, 2014 (33 pgs).

Office Action issued in U.S. Appl. No. 13/336,355, dated Aug. 30, 2013 (19 pgs).

Office Action issued in U.S. Appl. No. 13/336,355, dated Mar. 12, 2014 (21 pgs).

Office Action issued in U.S. Appl. No. 13/336,721, dated Mar. 6, 2014 (21 pgs).

Office Action issued in U.S. Appl. No. 13/339,667, dated Dec. 20, 2013 (18 pgs).

Office Action issued in U.S. Appl. No. 13/339,667, dated Oct. 2, 2014 (18 pgs).

Office Action issued in U.S. Appl. No. 13/354,147, dated Jan. 29, 2015 (6 pgs).

Office Action issued in U.S. Appl. No. 13/354,147, dated Jul. 16, 2014 (10 pgs).

Office Action issued in U.S. Appl. No. 13/475,799, dated Jul. 21, 2014 (24 pgs).

Office Action issued in U.S. Appl. No. 13/628,567, dated Aug. 20, 2014 (19 pgs).

Office Action issued in U.S. Appl. No. 13/650,823, dated May 9, 2014 (16 pgs).

Office Action issued in U.S. Appl. No. 13/650,823, dated Sep. 26, 2014 (16 pgs).

Office Action issued in U.S. Appl. No. 13/336,721, dated Sep. 5, 2013 (21 pgs).

TOUCH SENSOR AND TOUCH DISPLAY APPARATUS AND DRIVING METHOD THEREOF

RELATED APPLICATIONS

This application is a continuation-in-part of U.S. application Ser. No. 13/328,067, filed Dec. 16, 2011 now U.S. Pat. No. 8,933,897, which claims priority to Taiwan Application Serial Number 099144256, filed Dec. 16, 2010, currently pending. The present application is also based on, and claims priority from Taiwan Application Serial Number 100103923 filed Feb. 1, 2011. All of these applications are incorporated herein by this reference.

BACKGROUND

1. Field of Invention

The present invention relates to a touch sensor and driving method thereof, and more particularly to a dual-mode touch sensing apparatus and method thereof.

2. Description of Related Art

Regarding the developing of display technology, novel displays have been used in many types of portable device, such as a notebooks, a mobile phones, a digital camera and other electronic product. For avoiding these portable devices too heavy, the input apparatus have been changed from keyboards to touch panel.

Typically, three main sensing control technologies are used in touch panel including resistive touch sensing technology, electromagnetic touch sensing technology and capacitive touch sensing technology. According to the capacitive touch sensing technology, only one side of the insulator is coated with a conductive layer. A small voltage is applied to the layer, resulting in a uniform electrostatic field. When a conductor, such as a human finger, touches the uncoated surface, a capacitor is dynamically formed. The sensor's controller can determine the location of the touch indirectly from the change in the capacitance as measured from the four corners of the panel.

On the other hand, a sensor board using the electromagnetic sensing technology includes a substrate with an antenna array, a control circuit for calculating the touch position and a sensing pen. The sensing pen is a transceiver and the substrate with the antenna array is a receiver. When a user uses the sensing pen to touch the electronic paper display, magnetic flux is changed. A micro-controller can detect the change of the magnetic flux to calculate the touch position.

Typically, a touch panel using the capacitive touch sensing technology has those advantages including waterproof, anti scratch and high rate of transmission. Moreover, it is also very convenience for a user to use his finger to control this kind of touch panel. However, when a control point shown in the touch panel is very smaller than the size of human finger, it is very possible to touch other control point to trigger an unwanted function while a user uses his finger to touch this control point. Therefore, a new touch panel design that can provides different sensing supports is required.

SUMMARY

An object of the present invention is to provide a dual-mode sensing apparatus can provide supports in both electromagnetic touch sensing technology and capacitive touch sensing technology. When the dual-mode sensing apparatus provides support in electromagnetic touch sensing technology, a pen with a device can sense the change of magnetic flux is used to input information to the dual-mode sensing apparatus. When the dual-mode sensing apparatus provides support in capacitive touch sensing technology, a finger of the user is used to input information to the dual-mode sensing apparatus. Users can use different input methods to input information. Therefore, it is very convenience for users.

The present invention provides a dual-mode touch sensing apparatus. This apparatus comprises a sensor, a plurality of first conductive line, a first direction selection line, and a first direction transmission line arranged in parallel to each other and in a first direction, wherein the first direction selection line corresponds to the first direction transmission line, and a plurality of second conductive line, a second direction selection line, and a second direction transmission line arranged in parallel to each other and in a second direction, wherein the second conductive lines, the second direction selection line and the second direction transmission line cross the first conductive lines, the first direction selection line and the first direction transmission line. The sensor transfers a control signal to the first direction selection line to switch the connection between the second conductive lines and the first direction transmission line, and transfers a control signal to the second direction selection line to switch the connection between the first conductive lines and the second direction transmission line.

In an embodiment, the first direction selection line further includes a first direction first selection line, a first direction second selection line and a first direction third selection line, the first direction transmission line further includes a first direction first transmission line, a first direction second transmission line and a first direction third transmission line, the second direction selection line further includes a second direction first selection line, a second direction second selection line and a second direction third selection line, the second direction transmission line further includes a second direction first transmission line, a second direction second transmission line and a second direction third transmission line.

In an embodiment, when the dual-mode touch sensing apparatus performs an electromagnetic touch sensing technology, the sensor transfers a first control signal to the first direction first selection line to make the second conductive lines connect with the first direction first transmission line together, the sensor transfers a second control signal to the first direction second selection line to make the second conductive lines sequentially connect with the first direction second transmission line, the sensor transfers a third control signal to the first direction third selection line to make the second conductive lines sequentially connect with the first direction third transmission line, wherein the third control signal is behind the second control signal, the sensor transfers a fourth control signal to the second direction first selection line to make the first conductive lines connect with the second direction first transmission line together, the sensor transfers a fifth control signal to the second direction second selection line to make the first conductive lines sequentially connect with the second direction second transmission line, the sensor transfers a sixth control signal to the second direction third selection line to make the first conductive lines connect with the second direction third transmission line, wherein the sixth control signal is behind the fifth control signal, and the sensor performs a first sensing method to sense the magnetic flux, electromagnetic induction, current or frequency of loops to determine a touch position.

In an embodiment, the second control signal and the third control signal are first square wave signals, and the fifth control signal and the sixth control signal are second square wave signals.

In an embodiment, further comprising a plurality of switches located in the positions of the second conductive lines crossing the first direction first selection line, the first direction second selection line and the first direction third selection line, and located in the positions of the first conductive lines crossing the second direction first selection line, the second direction second selection line and the second direction third selection line.

In an embodiment, further comprising to form a loop in the second direction and to form a loop in the first direction. Forming a loop in the second direction comprises: the first control signal turns on the switches located in the positions of the second conductive lines crossing the first direction first selection line to make the second conductive lines to connect with the first direction first transmission line together, the second control signal turns on at least one of the switches located in the positions of the second conductive lines crossing the first direction second selection line to make the at least on of the second conductive lines to connect with the first direction second transmission line, the third control signal turns on at least one of the switches located in the positions of the second conductive lines crossing the first direction third selection line to make at least one of the second conductive lines to connect with the first direction third transmission line. Forming a loop in the second direction, comprises the fourth control signal turns on the switches located in the positions of the first conductive lines crossing the second direction first selection line to make the first conductive lines to connect with the second direction first transmission line together, the fifth control signal turns on at least one of the switches located in the positions of the first conductive lines crossing the second direction second selection line to make the at least on of the first conductive lines to connect with the second direction second transmission line, the sixth control signal turns on at least one of the switches located in the positions of the first conductive lines crossing the second direction third selection line to make at least one of the first conductive lines to connect with the second direction third transmission line, the sensor performs the first sensing method to sense the magnetic flux, electromagnetic induction, current or frequency of loops to determine a touch position.

In an embodiment, the first sensing method is to transfer a sensing signal with a special frequency to the sensing loops to sense the magnetic flux, electromagnetic induction, current or frequency of the sensing loops, wherein the sensor determine whether or not the magnetic flux, electromagnetic induction, current or frequency of the sensing loops are changed.

In an embodiment, when the dual-mode touch sensing apparatus performs an capacitive touch sensing technology, the sensor transfers a first control signal to the first direction first selection line to disconnect the second conductive lines with the first direction first transmission line, the sensor transfers a second control signal to the first direction second selection line to make the second conductive lines sequentially connect with the first direction second transmission line, the sensor transfers a third control signal to the first direction third selection line to disconnect the second conductive lines with the first direction third transmission line, the sensor transfers a fourth control signal to the second direction first selection line to disconnect the first conductive lines with the second direction first transmission line together, the sensor transfers a fifth control signal to the second direction second selection line to make the first conductive lines sequentially connect with the second direction second transmission line, the sensor transfers a sixth control signal to the second direction third selection line to disconnect the first conductive lines with the second direction third transmission line, and the sensor performs a second sensing method to sense the change of the capacitance, current or voltage of the first conductive lines and the second conductive lines to determine a touch position.

In an embodiment, the second sensing method is the sensor transfers a sensing signal through the first direction second transmission line to the second conductive lines, and transfers a sensing signal through the second direction second transmission line to the first conductive lines to sense the change of the capacitance, current or voltage of the first conductive lines and the second conductive lines to determine a touch position.

In an embodiment, the first direction selection line further includes a first direction first selection line, the first direction transmission line includes a first direction first transmission line, the second direction selection line further includes a second direction first selection line, and the second direction transmission line further includes a second direction first transmission line.

In an embodiment, when the dual-mode touch sensing apparatus performs an capacitive touch sensing technology, the sensor transfers a control signal to the first direction first selection line to make the second conductive lines connect with the first direction first transmission line sequentially, and the sensor transfers a control signal to the second direction first selection line to make the first conductive lines sequentially connect with the second direction first transmission line sequentially, the sensor performs a sensing method to sense the magnetic flux, electromagnetic induction, current or frequency of loops to determine a touch position.

In an embodiment, the sensing method is the sensor transfers a exciting signal through the first direction first transmission line to the second conductive lines, and sequentially detects each of the first conductive lines through the second direction first transmission line to sense the change of the capacitance, current or voltage of the first conductive lines and the second conductive lines to determine a touch position.

In an embodiment, the first conductive lines and the second conductive lines includes the data lines, the scan lines, the power lines, the Bias lines, the common electrode lines, the reading lines and the control lines of a display.

In an embodiment, the sensor is integrated into a gate driver of a display or integrated into a source driver of a display. The display is an Organic Light Emitting Display, a thin film transistor liquid crystal display, an Electrode Wetting display or an electrophoretic display.

The present invention also provides an image gathering apparatus with a dual-mode touch sensing apparatus and an array for gathering images, wherein the array is a CCD array, a CMOS array, an X-ray sensing array or an optical device array, a dual-mode touch sensing apparatus. This dual-mode touch sensing apparatus comprises a sensor, a plurality of first conductive line, a first direction selection line, and a first direction transmission line arranged in parallel to each other and in a first direction, wherein the first direction selection line corresponds to the first direction transmission line, and a plurality of second conductive line, a second direction selection line, and a second direction transmission line arranged in parallel to each other and in a second direction, wherein the second conductive lines, the second direction selection line and the second direction transmission line cross the first conductive lines, the first direction selection line and the first direction transmission line. The sensor transfers a control signal to the first direction selection line to switch the connection between the second conductive lines and the first direction transmission line, and transfers a control signal to the second direction selection line to switch the connection between the first conductive lines and the second direction transmission line.

In an embodiment, the first conductive lines and the second conductive lines includes the data lines, the scan lines, the power lines, the Bias lines, the common electrode lines, the reading lines and the control lines of the array.

In an embodiment, the array gather a first information including an image, a gesture or a facial expression, and the dual-mode touch sensing apparatus senses a second information including a position, a height or an action.

In an embodiment, further comprising to build a relation and give a response based on the first information and the second first information. The relation and the response includes numbers, characters, accomplished, OK, stop, a crash, or death, crying, laughing, angry, sad, to encode or discoed the gathered data, to calculate or compare the gathered data, to transfer the gathered data, to display the gathered data or images, or to compare the images.

Accordingly, the dual-mode touch sensor of the present invention uses control signals to select sensing electrode. Therefore, the hardware cost is reduced. Moreover, in an embodiment, the claimed invention provides two types of sensing technology, the electromagnetic touch sensing technology and the capacitive touch sensing technology, to determine the touch position. In the electromagnetic touch sensing technology, a user can use a pen with a magnetic sensing loop or a LC loop to write. In the capacitive touch sensing technology, a user can use his finger to write. That is, the present invention provides different input interface to the user to increase the input convenience. Moreover, the data line the scan lines, the power lines, the Bias lines, the common electrode lines, the reading lines and the control lines of the display can be used to serve as the electrode of the dual-mode touch sensor of the present invention. Accordingly, it is not necessary to form additional electrodes for sensing the touch position. Therefore, the production cost is reduced and the production yield is kept.

BRIEF DESCRIPTION OF THE DRAWINGS

In order to make the foregoing as well as other aspects, features, advantages, and embodiments of the present invention more apparent, the accompanying drawings are described as follows.

DETAILED DESCRIPTION

Figure 1A:
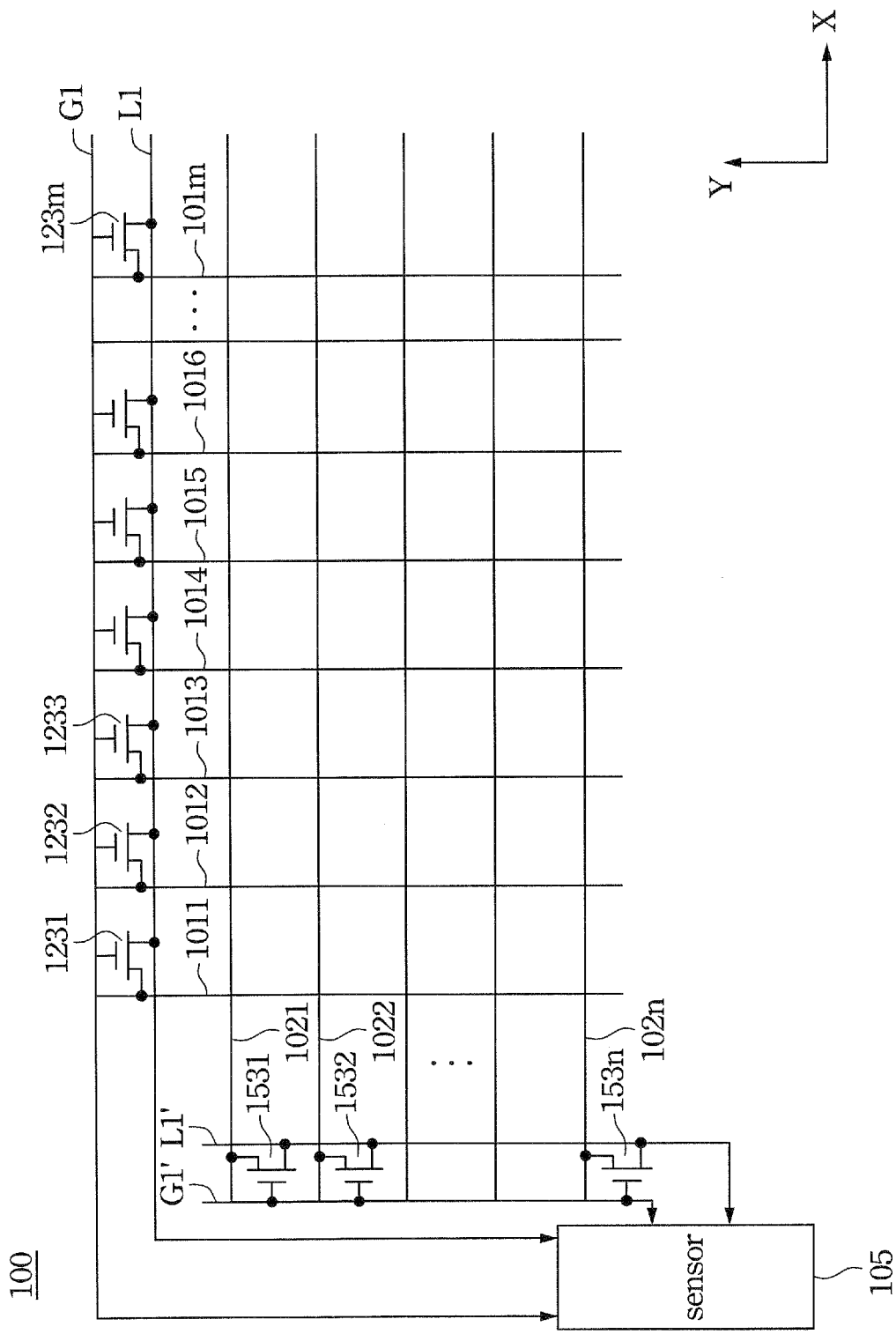
FIG. 1A illustrates a schematic diagram of an electrode structure of a touch sensor according to a preferred embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1A illustrates a schematic diagram of an electrode structure of a touch sensor. The electrode structure of the touch sensor 100 of the present invention is formed in a substrate. The electrode structure includes a plurality of first conductive line 1011~101m arranged in a first direction, such as Y direction, and a plurality of second conductive line 1021~102n arranged in a second direction, such as X direction. The first conductive lines 1011~101m cross the second conductive lines 1021~102n. The first conductive lines 1011~101m and the second conductive lines 1021~102n are formed in different layers and are separated by an insulation layer over the substrate. In an embodiment, the first direction and the second direction have an included angle of 90 degrees. However, in another embodiments, the first direction and the second direction can have included angle, such as 60 degrees, 45 degrees, 36 degrees or 30 degrees. The material for forming the first conductive lines 1011~101m and the second conductive lines 1021~102n is metal, compound metal, Carbon Nanotubes, transparent conductor material, such as ITO, IZO.

One side of the first conductive lines 1011~101m is coupled with a first selection line G1 and a first transmission line L1. The first selection line G1 sends selection signals to control some of the first conductive lines 1011~101m to connect with the first transmission line L1 to perform a sensing technology, such as a capacitive touch sensing technology. In an embodiment, the first conductive lines 1011~101m are connected to the first selection line G1 and the first transmission line L1 through switches 1231~123m respectively. In an embodiment, the switches 1231~123m are thin film transistors (TFT). The gate electrodes of the switches 1231~123m are connected to the first selection line G1. When a square wave selection signal is transferred in the first selection line G1, the switches 1231~123m receiving the square wave selection signal are turned on to make the first conductive lines 1011~101m connect with the first transmission line L1.

Then, the sensor 105 can send sensing signal to the first transmission line L1 to perform a capacitive touch sensing technology. In another embodiment, the above electrode structure and sensing method can also be applied to a resistance touch sensing technology, a pressure touch sensing technology, or an optical touch sensing technology.

On the other hand, one side of the second conductive lines 1021~102n is coupled with a first selection line G1' and a first transmission line L1'. The first selection line G1' sends selection signals to control some of the second conductive lines 1021~102n to connect with the first transmission line L1' to perform a sensing technology, such as a capacitive touch sensing technology. In an embodiment, the second conductive lines 1021~102n are connected to the first selection line G1' and the first transmission line L1' through switches 1531~153n respectively. In an embodiment, the switches 1531~153n are thin film transistors (TFT). The gate electrodes of the switches 1531~153n are connected to the first selection line G1'. When a square wave selection signal is transferred in the first selection line G1', the switches 1531~153n receiving the square wave selection signal are turned on to make the second conductive lines 1021~102n connect with the first transmission line L1'. Then, the sensor 105 can send sensing signal to the first transmission line L1' to perform a capacitive touch sensing technology. In another embodiment, the above electrode structure and sensing method can also be applied to a resistance touch sensing technology, a pressure touch sensing technology, or an optical touch sensing technology.

In an embodiment, the sensor 105 can provides supports in electromagnetic touch sensing technology, capacitive touch sensing technology, resistance touch sensing technology, pressure touch sensing technology, or optical touch sensing technology to calculate the position and height. In an embodiment, the sensor 105 provides an exciting signal or a detecting signal to sense the signal in some of the first conductive lines 1011~101m that are selected by the first selection line G1 and provides an exciting signal or a detecting signal to sense the signal in some of the second conductive lines 1021~102n that are selected by the first selection line G1'.

Typically, there are two types of the capacitive touch sensing technology. One is self-capacitance touch sensing technology. The other is Mutual-capacitance touch sensing technology. Therefore, when a capacitive touch sensing technology is performed by the touch sensor 100, according to the self-capacitance touch sensing technology, the sensor 105 senses the capacitance generated between the first conductive lines 1011~101m and the ground and between the second conductive lines 1021~102n and the ground to determine the touch position. Therefore, when a finger of a user touches a position, charges located in this position are moved from the first conductive lines 1011~101m or the second conductive lines 1021~102n to the finger of the user, which changes the capacitance in this position. In this case, the sensor 105 can sense this change of the capacitance in this position to determine the position. Accordingly, when the self-capacitance touch sensing technology is performed, the sensor 105 sends a selection signal to the first selection lines G1 and G1' to make the first conductive lines 1011~101m and the second conductive lines 1021~102n connect with the first transmission line L1 and L1'. Then, the sensing signal sent by the sensor 105 is transferred to the first conductive lines 1011~101m and the second conductive lines 1021~102n through the first transmission line L1 and L1' to determine the position whose capacitance is changed. Then, the sensor 105 can calculate the touching position based on the change of the capacitance.

On the other hand, according to the mutual-capacitance touch sensing technology, the sensor 105 senses the capacitance generated between the first conductive lines 1011~101m and the second conductive lines 1021~102n to determine the touch position. That is, the first conductive lines 1011~101m and the second conductive lines 1021~102n are the two electrodes of capacitors. Therefore, when a finger of a user touches a position, charges located in this position are moved from the first conductive lines 1011~101m or the second conductive lines 1021~102n to the finger of the user, which changes the capacitance in this position. In this case, the sensor 105 can sense this change of the capacitance in this position to determine the position. Accordingly, when the mutual-capacitance touch sensing technology is performed to sense the touch position, the sensor 105 sends sensing signal to the first conductive lines 1011~101m through the first transmission line L1 and receives the sensing signal from the second conductive lines 1021~102n through the first transmission line L1' to determine the position whose capacitance is changed. Or, the sensor 105 sends sensing signal to the second conductive lines 1021~102n through the first transmission line L1' and receives the sensing signal from the first conductive lines 1011~101m through the first transmission line L1 to determine the position whose capacitance is changed. Then, the sensor 105 can calculate the touching position based on the change of the capacitance. It is noticed that the sensing method can also be applied to a resistance touch sensing technology, a pressure touch sensing technology, or an optical touch sensing technology.

On the other hand, the electrode structure of a touch sensor according to a preferred embodiment of the present invention can be integrated into the array electrode of a display panel. That is, the array electrode of a display panel can be used to serve as the electrode of the touch sensor of the present invention.

Figure 1B:
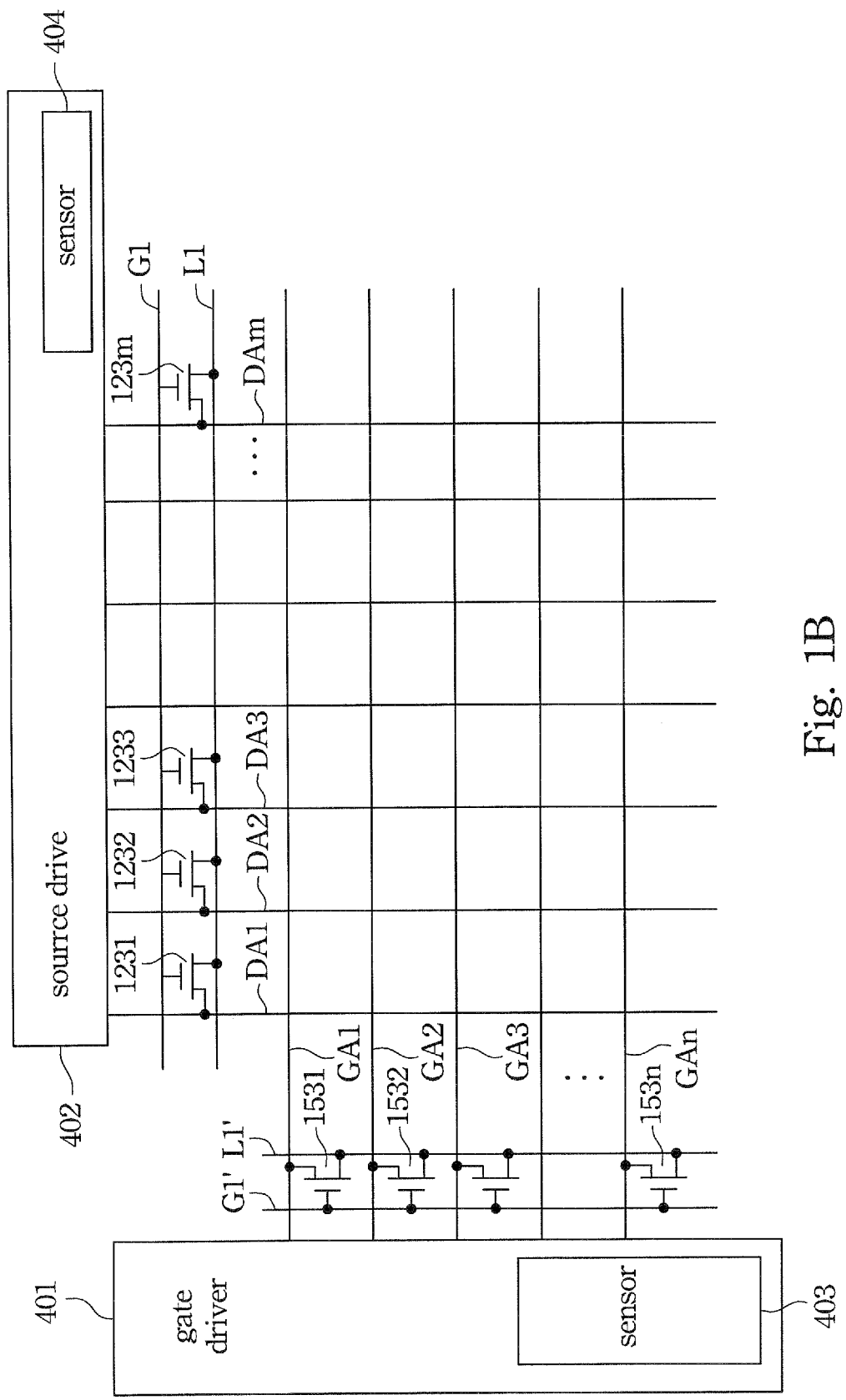
FIG. 1B illustrates a schematic diagram of an electrode structure of a touch sensor that is integrated with an electrode structure of a display according to a preferred embodiment of the present invention.

FIG. 1B illustrates a schematic diagram of an electrode structure of a touch sensor that is integrated with an electrode structure of a display according to a preferred embodiment of the present invention. The display panel is composed of a plurality of data lines DA1, DA2 . . . DAm and a plurality of scan lines GA1, GA2, . . . , GAn. The data lines cross the scan lines. In this embodiment, the data lines DA1, DA2 . . . DAm serve as the first conductive lines 1011~101m. The scan lines GA1, GA2, . . . , GAn serve as the second conductive lines 1021~102n. In this embodiment, sensor 403 is integrated into the gate driver 401. Sensor 404 is integrated into the source driver 402. Sensor 403 is used to sense the touch events in the X-direction. Sensor 404 is used to sense the touch events in the Y-direction. In another embodiment, sensors 403 and 404 are built in a timing controller. In further embodiment, sensors 403 and 404 are integrated circuits and built in the region surrounded the pixel array.

Figure 1C:
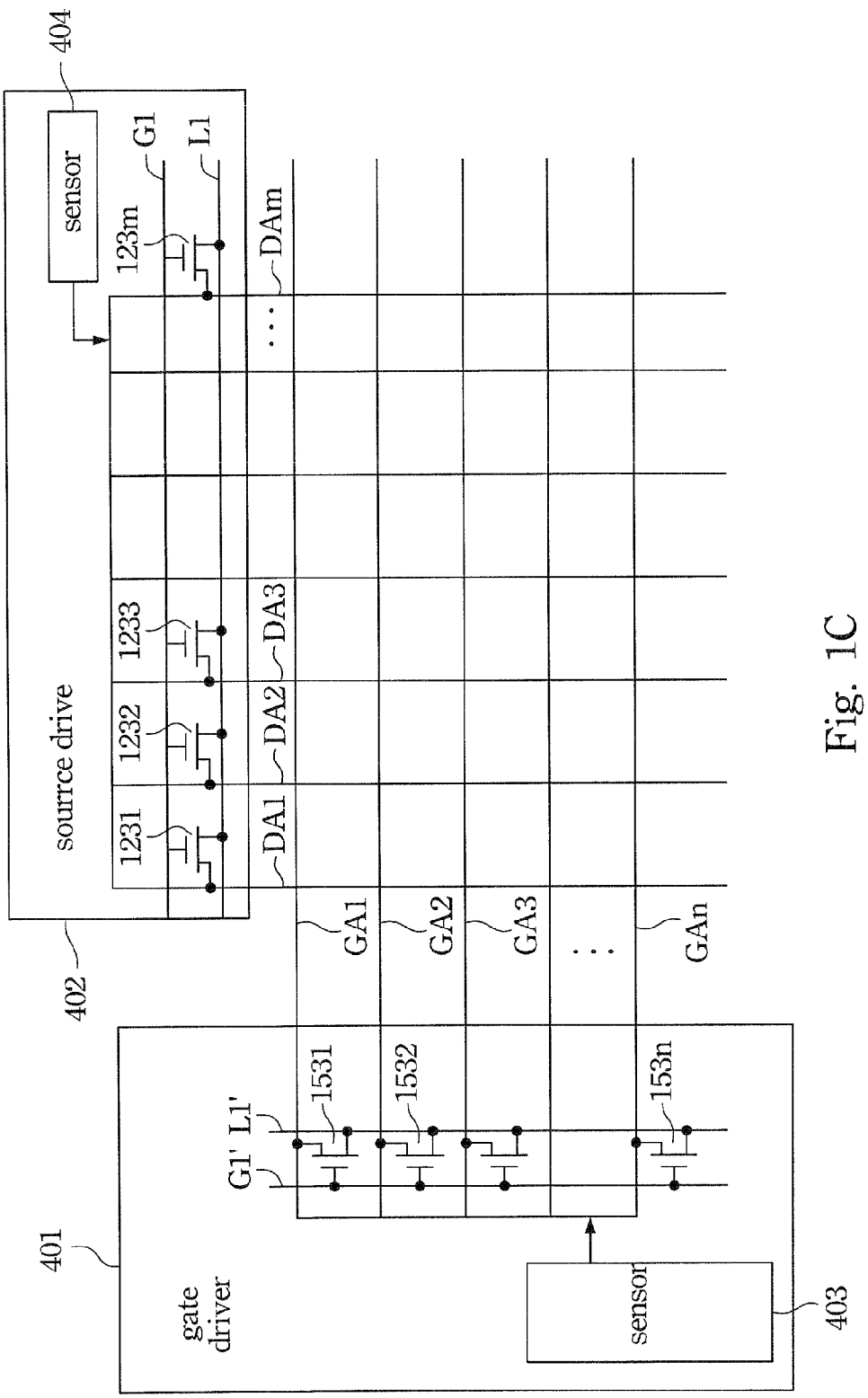
FIG. 1C illustrates a schematic diagram of an electrode structure of a touch sensor that is integrated with an electrode structure of a display according to another preferred embodiment of the present invention.

The sensor 404 can transfer a control signal to turn on the switches 1231~123m to make the data lines DA1, DA2 . . . DAm connect with the first transmission line L1. On the other hand, the sensor 403 can also transfer a control signal to turn on the switches 1531~153n to make the scan lines GA1, GA2 . . . GAn connect with the first transmission line L1'. In an embodiment, the switches 1231~123m and the switches 1531~153n are thin film transistors (TFT) or other devices with the same function as the thin film transistors. When the switches are thin film transistors, the switches can be formed on the array substrate. In another embodiment, as shown in FIG. 1C, the switches 1231~123m can be integrated into the source driver 402, the switches 1531~153n can be integrated into the gate driver 401.

Moreover, the display is an Organic Light Emitting Display, a thin film transistor liquid crystal display, an Electrode Wetting display or an electrophoretic display. The pixel array of this display is a transmissive-mode pixel array, a reflective-mode pixel array or a dual-mode transflective pixel array.

Figure 2A:
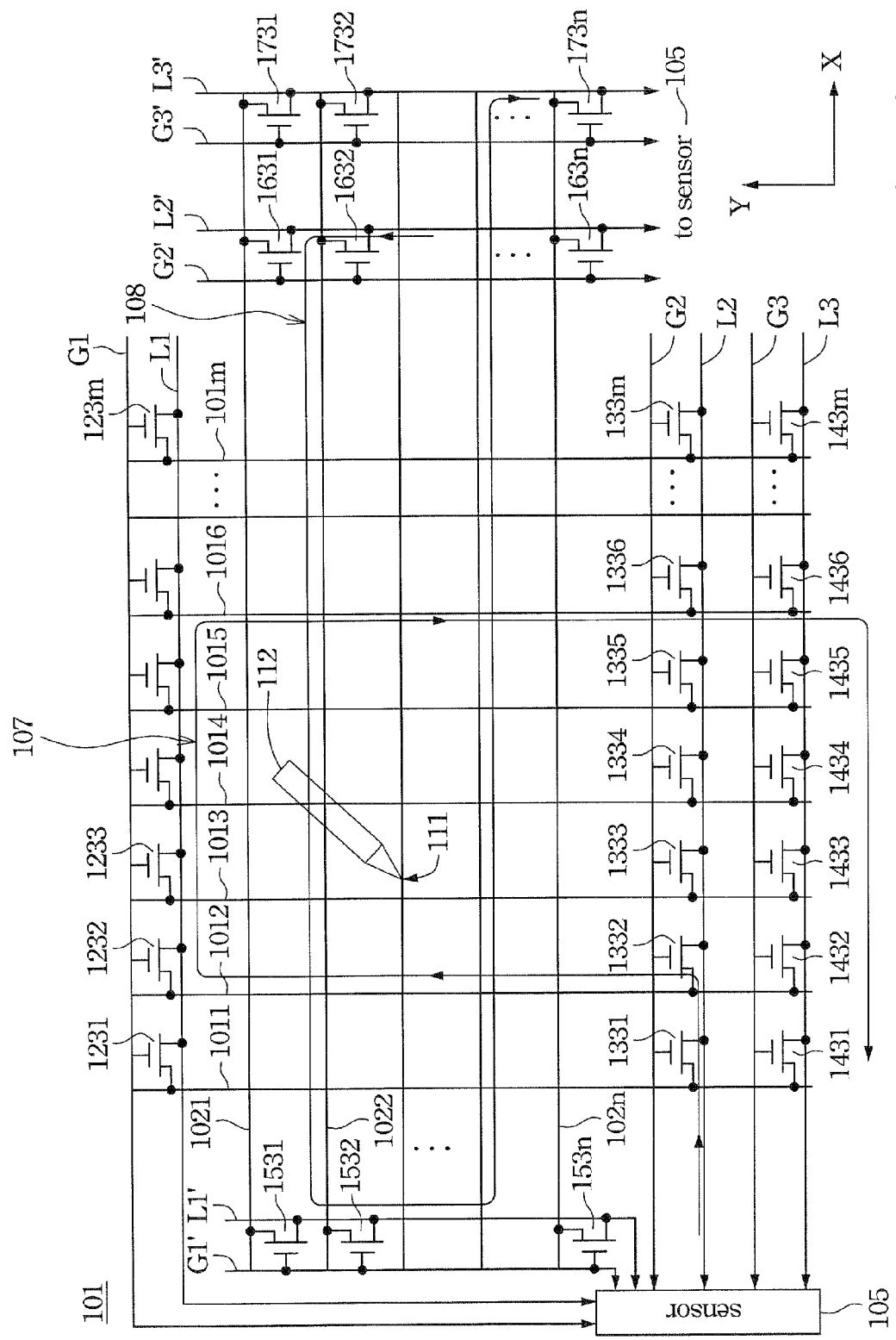
FIG. 2A illustrates a schematic diagram of an electrode structure of a dual-mode touch sensor according to a preferred embodiment of the present invention.

FIG. 2A illustrates a schematic diagram of an electrode structure of a dual-mode touch sensor according to a preferred embodiment of the present invention. In a preferred embodiment, the dual-mode touch sensor can perform an electromagnetic touch sensing technology and a capacitive touch sensing technology. In another embodiment, the above electrode structure and sensing method can also be applied to a resistance touch sensing technology, a pressure touch sensing technology, or an optical touch sensing technology.

According to the preferred embodiment, the dual-mode touch sensor can perform an electromagnetic touch sensing technology and a capacitive touch sensing technology. The electrode structure of the touch sensor 101 of the present invention is formed in a substrate. The electrode structure includes a plurality of first conductive line 1011~101m arranged in a first direction, such as Y direction, and a plurality of second conductive line 1021~102n arranged in a second direction, such as X direction. The first conductive lines 1011~101m cross the second conductive lines 1021~102n. The first conductive lines 1011~101m and the second conductive lines 1021~102n are formed in different layers and are separated by an insulation layer over the substrate. In an embodiment, the first direction and the second direction have an included angle of 90 degrees. However, in another embodiments, the first direction and the second direction can have included angle, such as 60 degrees, 45 degrees, 36 degrees or 30 degrees. The material for forming the first conductive lines 1011~101m and the second conductive lines 1021~102n is metal, compound metal, Carbon Nanotubes, transparent conductor material, such as ITO, IZO.

One side of the first conductive lines 1011~101m is coupled with a first selection line G1 and a first transmission line L1. The other side of the first conductive lines 1011~101m is coupled with a second selection line G2, a second transmission line L2, a third selection line G3 and a third transmission line L3. The first selection line G1 sends selection signals to control some of the first conductive lines 1011~101m to connect with the first transmission line L1. The second selection line G2 sends selection signals to control some of the first conductive lines 1011~101m to connect with the second transmission line L2. The third selection line G3 sends selection signals to control some of the first conductive lines 1011~101m to connect with the third transmission line L3. The first transmission line L1, the second transmission line L2 and the third transmission line L3 are used to send sensing signal to perform an electromagnetic touch sensing technology and a capacitive touch sensing technology.

In an embodiment, the first conductive lines 1011~101m are connected to the first selection line G1 and the first transmission line L1 through switches 1231~123m respectively. The first conductive lines 1011~101m are connected to the second selection line G2 and the second transmission line L2 through switches 1331~133m respectively. The first conductive lines 1011~101m are connected to the third selection line G3 and the third transmission line L3 through switches 1431~143m respectively. In an embodiment, the switches 1231~123m, 1331~133m and 1431~143m are thin film transistors (TFT). The gate electrodes of the switches 1231~123m are connected to the first selection line G1. The gate electrodes of the switches 1331~133m are connected to the second selection line G2. The gate electrodes of the switches 1431~143m are connected to the third selection line G3. When a square wave selection signal is transferred in the second selection line G2 and the third selection line G3, the switches 1331~133m and the switches 1431~143m receiving the square wave selection signal are turned on to make the corresponding first conductive lines 1011~101m connect together to form a loop. Then, the sensor 105 can send sensing signal to the first transmission line L1 to perform a touch sensing technology.

On the other hand, one side of the second conductive lines 1021~102n are coupled with a first selection line G1' and a first transmission line L1'. The other side of the second conductive lines 1021~102n is coupled with a second selection line G2', a second transmission line L2', a third selection line G3' and a third transmission line L3'. The first selection line G1' sends selection signals to control some of the second conductive lines 1021~102n to connect with the first transmission line L1'. The second selection line G2' sends selection signals to control some of the second conductive lines 1021~102n to connect with the second transmission line L2'. The third selection line G3 sends selection signals to control some of the f second conductive lines 1021~102n to connect with the third transmission line L3'. The first transmission line L1', the second transmission line L2' and the third transmission line L3' are used to send sensing signal to perform an electromagnetic touch sensing technology and a capacitive touch sensing technology.

In an embodiment, the second conductive lines 1021~102n are connected to the first selection line G1' and the first transmission line L1' through switches 1531~153n respectively. The second conductive lines 1021~102n are connected to the second selection line G2' and the second transmission line L2' through switches 1631~163n respectively. The second conductive lines 1021~102n are connected to the third selection line G3' and the third transmission line L3' through switches 1731~173n respectively. In an embodiment, the switches 1531~153n, 1631~163n and 1731~173n are thin film transistors (TFT). The gate electrodes of the switches 1531~153n are connected to the first selection line G1'. The gate electrodes of the switches 1631~163n are connected to the second selection line G2'. The gate electrodes of the switches 1731~173n are connected to the third selection line G3'. When a square wave selection signal is transferred in the second selection line G2' and the third selection line G3', the switches 1631~163n and the switches 171~173n receiving the square wave selection signal are turned on to make the corresponding second conductive lines 1021~102n connect together to form a loop. Then, the sensor 105 can send sensing signal to the first transmission line L1 to perform a touch sensing technology.

In an embodiment, the sensor 105 can provides supports in electromagnetic touch sensing technology, capacitive touch sensing technology, resistance touch sensing technology, pressure touch sensing technology, or optical touch sensing technology to calculate the position and height. In an embodiment, the sensor 105 has a first sensing integrated circuit and a second sensing integrated circuit. The first sensing integrated circuit provides support in the capacitive touch sensing technology to calculate the position and height. The second sensing integrated circuit provides support in the electromagnetic touch sensing technology to calculate the position and height. The sensor 105 provides an exciting signal or a detecting signal to sense the signal in some of the first conductive lines 1011~101m that are selected by the second selection line G2 and the third selection line G3, and provides an exciting signal or a detecting signal to sense the signal in some of the second conductive lines 1021~102*n* that are selected by the second selection line G2' and the third election line G3'.

Figure 2B:
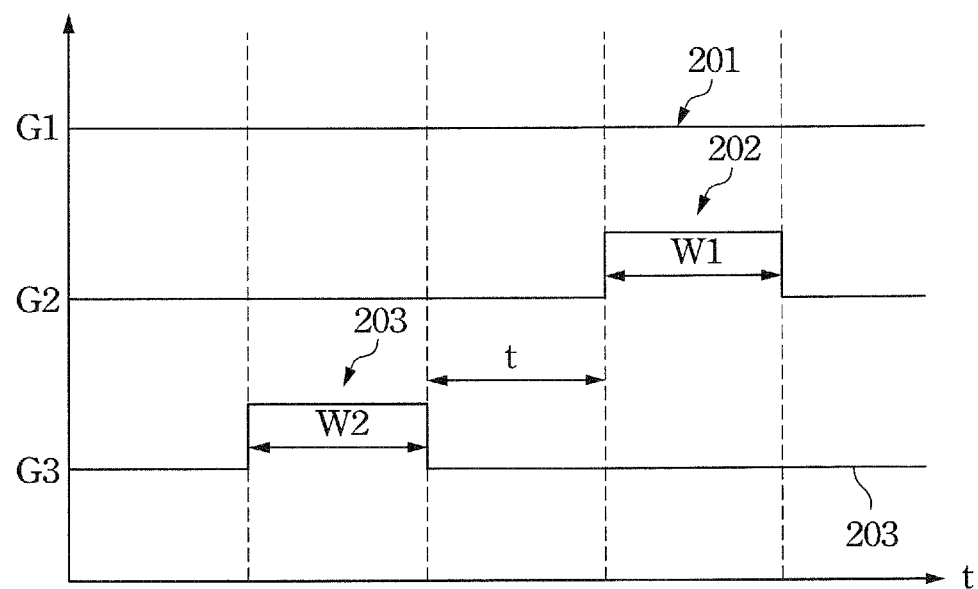
FIG. 2B illustrates a schematic diagram of a control signal of an electromagnetic touch sensing technology used to perform a Y-direction sensing according to a preferred embodiment of the present invention.

FIG. 2B illustrates a schematic diagram of a control signal of an electromagnetic touch sensing technology used to perform a Y-direction sensing according to a preferred embodiment of the present invention. In this embodiment, the sensor 105 sends a first control signal 201 to the first selection line G1 to turn on all the switches 1231~123*m*. In an embodiment, when the switches 1231~123*m* are N-type thin film transistors. The first control signal 201 is in a high level state. In contrast, when the switches 1231~123*m* are P-type thin film transistors. The first control signal 201 is in a low level state. In this embodiment, the switches 1231~123*m* are N-type thin film transistors. Therefore, the first control signal 201 is in a high level state. When all the switches 1231~123*m* are turned on, the first conductive lines 1011~101*m* are connected to the first transmission line L1 through the switches 1231~123*m*.

On the other hand, the sensor 105 sends a second control signal 202 to the second selection line G2 to turn on the switches 1331~133*m*. In an embodiment, the second control signal 202 is a square wave signal. The square wave signal has a time width W1. The time width W1 is equal to the time period to scan some of the first conductive lines 1011-101*m* at a same time. For example, in an embodiment, scanning all the first conductive lines 1011~101*m* needs a T time period. Therefore, scanning each of the first conductive lines 1011~101*m* needs a T/m time period. In other words, the time period is K*T/m when K number of the first conductive lines 1011~101*m* are scanned at a same time. Therefore, time width W1 is as following equation.

$$\frac{T}{m} \times z \le W1 < \frac{T}{m} \times (z+1)$$

Z is the number of the first conductive lines 1011~101*m* that are scanned at a same time. Therefore, if Z number of the first conductive lines 1011~101*m* is required to scan at a same time, the time width W1 must be less than $(Z+1)*T/m$ to prevent an additional first conductive line being conducted.

Accordingly, when the second control signal 202 with a square wave type is transferred to the second selection line G2, switches 1331~133*m* receiving the second control signal 202 are turned on to make some of the first conductive lines 1011~101*m* connect with the second transmission line L2 through the turned on switches 1331~133*m*. Because the switches 1331~133*m* are turned on by the second control signal 202 sequentially, and because the time width W1 is set to be larger than $(Z*T/m)$ and less than $(Z+1)*T/m$, that is, Z number of the first conductive lines 1011~101*m* is scanned at a same time, the first conductive lines 1011~101*m* are grouped into a plurality of groups to connected to the second transmission line L2. Each group has z number of the first conductive lines 1011~101*m*.

On the other hand, a third control signal 203 is sent to the third selection line G3 by the sensor 105 after t time period following the second control signal 202 sent to the second selection line G2. The t time period is related to the number of the first conductive lines 1011~101*m* surrounded by a loop. For example, when a loop can surround 30 first conductive lines 1011~101*m*, the t is equal to (T/m*30) time period. That is, the third control signal 203 is sent to the third selection line G3 by the sensor 105 after (T/m*30) time period following the second control signal 202 sent to the second selection line G2.

The third control signal 203 is a square wave signal. The square wave signal has a time width W2. The time width W2 is equal to the time period to scan some of the first conductive lines 1011~101*m* at a same time. For example, in an embodiment, scanning all the first conductive lines 1011~101*m* needs a T time period. Therefore, scanning each of the first conductive lines 1011~101*m* needs a T/m time period. In other words, the time period is K*T/m when K number of the first conductive lines 1011~101*m* are scanned at a same time. Therefore, time width W2 is as following equation.

$$\frac{T}{m} \times z \le W2 < \frac{T}{m} \times (z+1)$$

Z is the number of the first conductive lines 1011~101*m* that are scanned at a same time. Therefore, if Z number of the first conductive lines 1011~101*m* is required to scan at a same time, the time width W2 must be less than $(Z+1)*T/m$ to prevent an additional first conductive line being conducted.

Accordingly, when the third control signal 203 with a square wave type is transferred to the third selection line G3, switches 1431~143*m* receiving the third control signal 203 are turned on to make some of the first conductive lines 1011~101*m* connect with the third transmission line L3 through the turned on switches 1431~143*m*. Because the switches 1431~143*m* are turned on by the third control signal 203 sequentially, and because the time width W2 is set to be larger than $(Z*T/m)$ and less than $(Z+1)*T/m$, that is. Z number of the first conductive lines 1011~101*m* is scanned at a same time, the first conductive lines 1011~101*m* are grouped into a plurality of groups to connected to the third transmission line L3. Each group has z number of the first conductive lines 1011~101*m*.

It is noticed that, in another embodiment, the time width W1 is not equal to the time width W2. That is, the sensor 105 can send the second control signal 202 and the third control signal 203 that have different time widths to the second selection line G2 and the third selection line G3 respectively. Therefore, the number of the first conductive lines 1011~101*m* connected to the second transmission line L2 is different the number of the first conductive lines 1011~101*m* connected to the third transmission line L3.

Accordingly, when an electromagnetic touch sensing technology is performed to sense a loop that surrounds two first conductive lines, the sensor 105 sends a first control signal 201 to the first selection line G1 to turn on all the switches 1231~123*m*. When all the switches 1231~123*m* are turned on, the first conductive lines 1011~101*m* are connected to the first transmission line L1 through the switches 1231~123*m*. Next, the sensor 105 sends a second control signal 202 to the second selection line G2 to turn on the switches 1331~133*m* to make the first conductive lines 1011~101*m* connect with the second transmission line L2. In this embodiment, two switches of the switches 1331~133*m* are turned on together by the second control signal 202 each time to make two first conductive lines connect with the second transmission line L2 at a same time. The sensor 105 also sends a third control signal 203 to the third selection line G3 to turn on the switches 1431~143*m* to make the first conductive lines 1011~101*m* connect with the third transmission line L3. In this embodiment, two switches of the switches 1431~143*m* are turned on together by the third control signal 203 each time to make two first conductive lines connect with the third transmission line L3 at a same time.

In this embodiment, two first conductive lines are connected with the second transmission line L2 and the third transmission line L3 at a same time. Therefore, the time width W of the second control signal 202 and the third control signal 203 is as following equation.

$$\frac{T}{m} \times 2 \le W < \frac{T}{m} \times 3$$

Moreover, in this embodiment, each loop surrounds two first conductive lines. Therefore, the third control signal 203 is sent to the third selection line G3 by the sensor 105 after (T/m*2) time period following the second control signal 202 sent to the second selection line G2.

In an embodiment, a loop 107 is formed. N-type switches 1331 and 1332 are turned on by the second control signal 202 with a high level state. Then, the first conductive lines 1011 and 1012 are connected to the second transmission line L2 through the switches 1331 and 1332. N-type switches 1435 and 1436 are turned on by the third control signal 203 with a high level state. Then, the first conductive lines 1015 and 1016 are connected to the third transmission line L3 through the switches 1435 and 1436. The loop 107 surrounds two first conductive lines 1013 and 1014. Next, the sensor 105 sends a sensing signal to the first conductive lines 1011 and 1012 through the second transmission line L2 and receives a sensing signal from the first conductive lines 1015 and 1016 through the third transmission line L3 to detect whether or not the sensing signal in the loop 107 is changed. In an embodiment, the sensor 105 can determine whether or not the magnetic flux, electromagnetic induction, current or frequency is changed based on the sensing signal whether or not is changed. In an embodiment, the sensing signal is a square wave signal, a triangle wave signal, a like-triangle wave signal or a wave signal composed of a plurality of square wave signals. The change of the sensing signal includes the distorted of the wave, the change of the average value of the signal, the change of the peak value of the signal, the change of the current or the change of the voltage.

Moreover, the second control signal 202 sent in the second selection line G2 is a square wave signal. The third control signal 203 sent in the third selection line G3 is also a square wave signal. Therefore, the loops are sequentially formed according to the second control signal 202 and the third control signal 203. The loops can overlap to one another to prevent a "sensing miss" case. For example, a loop A and a loop B are formed sequentially. The sensing loop A and the loop B has a overlap region to prevent a "sensing miss" case. Accordingly, the loops are formed by using the first control signal 201, the second control signal 202 and the third control signal 203 to control the first conductive lines 1011~101m to connect with the first transmission line L1, the second transmission line L2 and the third transmission line L3. The first control signal 201, the second control signal 202 and the third control signal 203 can be formed by software. Therefore, it is not necessary to add additional hardware in display. The production cost is reduced.

Figure 2C:
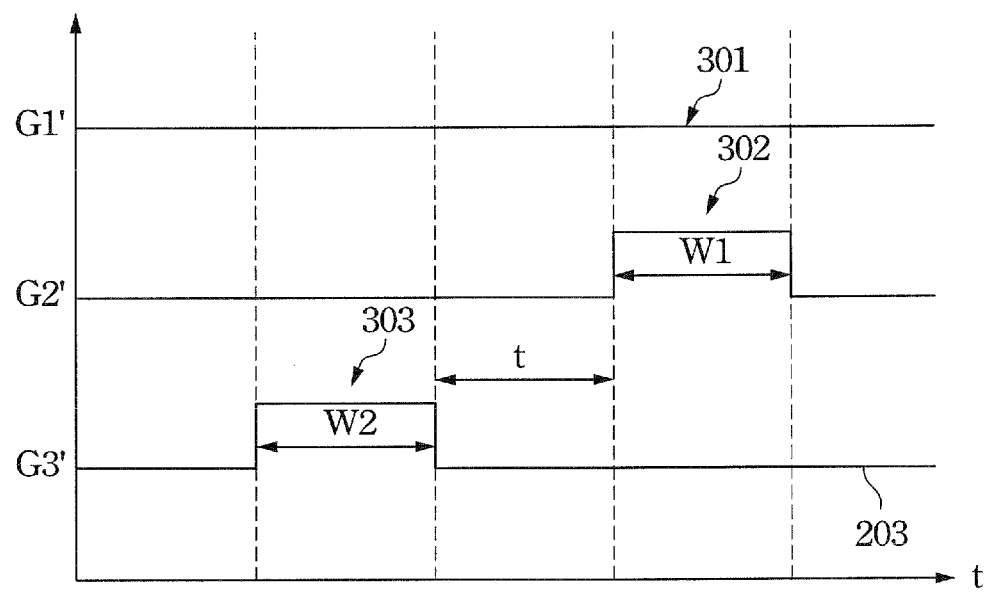
FIG. 2C illustrates a schematic diagram of a control signal of an electromagnetic touch sensing technology used to perform a X-direction sensing according to a preferred embodiment of the present invention.

The above method can be also applied in the second conductive line 1021~102n to detect the touch position. FIG. 2C illustrates a schematic diagram of a control signal of an electromagnetic touch sensing technology to perform a X-direction sensing according to a preferred embodiment of the present invention. The sensor 105 sends a first control signal 301 to the first selection line G1' to turn on all the switches 1531~153n. When all the switches 1531~153n are turned on, the second conductive lines 1021~102n are connected to the first transmission line L1' through the switches 1531~153n. Next, the sensor 105 sends a second control signal 302 to the second selection line G2' to turn on the switches 1631~163n to make the second conductive lines 1021~102n connect with the second transmission line L2'. In this embodiment, switches 1631~163n are sequentially turned on by the second control signal 302 to make second conductive lines 1021~102n connect with the second transmission line L2' sequentially. The sensor 105 also sends a third control signal 303 to the third selection line G3' to turn on the switches 1731~173n to make the second conductive lines 1021~102n connect with the third transmission line L3'. In this embodiment, switches 1731~173n are turned on sequentially by the third control signal 303 to make second conductive lines 1021~102n connect with the third transmission line L3' sequentially.

In an embodiment, the second control signal 302 is a square wave signal. The square wave signal has a time width W1'. The time width W1' is equal to the time period to scan some of the second conductive lines 1021~102n at a same time. For example, in an embodiment, scanning all the second conductive lines 1021~102n needs a T' time period. Therefore, scanning each of the second conductive lines 1021~102n needs a (T'/n) time period. In other words, the time period is (K*T'/n) when K number of the second conductive lines 1021~102n are scanned at a same time. Therefore, time width W1' is as following equation.

$$\frac{T}{n} \times z \le W1' < \frac{T}{n} \times (z+1)$$

Z is the number of the second conductive lines 1021~102n that are scanned at a same time.

Similarly, the third control signal 303 is a square wave signal. The square wave signal has a time width W2'. The time width W2' is equal to the time period to scan some of the second conductive lines 1021~102n at a same time. For example, in an embodiment, scanning all the second conductive lines 1021~102n needs a T' time period. Therefore, scanning each of the second conductive lines 1021~102n needs a (T'/n) time period. In other words, the time period is (K*T'/n) when K number of the second conductive lines 1021~102n are scanned at a same time. Therefore, time width W2' is as following equation.

$$\frac{T}{n} \times z \le W2' < \frac{T}{n} \times (z+1)$$

Z is the number of the second conductive lines 1021~102n that are scanned at a same time.

On the other hand, the third control signal 303 is sent to the third selection line G3' by the sensor 105 after t time period following the second control signal 302 sent to the second selection line G2'. The t time period is related to the number of the second conductive lines 1021~102n surrounded by a loop. For example, when a loop can surround 30 second conductive lines 1021~102n, the t is equal to (T/n*30) time period. That is, the third control signal 303 is sent to the third selection line G3' by the sensor 105 after (T/n*30) time period following the second control signal 302 sent to the second selection line G2'. By controlling the second control signal 302 and the third control signal 303, loops are sequentially formed in the second conductive lines 1021~102n. Therefore, an electromagnetic touch sensing technology is performed to sense loops to determine the touch position.

In an embodiment, a loop 108 is formed. N-type switches 1631 and 1632 are turned on by the second control signal 302 with a high level state. Then, the second conductive lines 1021 and 1022 are connected to the second transmission line L2' through the switches 1631 and 1632. N-type switches 1635 and 1636 are turned on by the third control signal 303 with a high level state. Then, the second conductive lines 1025 and 1026 are connected to the third transmission line L3' through the switches 1635 and 1636. The loop 108 surrounds two second conductive lines 1023 and 1024. Next, the sensor 105 sends a sensing signal to the second conductive lines 1021 and 1022 through the second transmission line L2' and receives a sensing signal from the second conductive lines 1025 and 1026 through the third transmission line L3' to detect whether or not the sensing signal in the loop 108 is changed. In an embodiment, the sensor 105 can determine whether or not the magnetic flux, electromagnetic induction, current or frequency is changed based on the sensing signal whether or not is changed. In an embodiment, the sensing signal is a square wave signal, a triangle wave signal, a like-triangle wave signal or a wave signal composed of a plurality of square wave signals. The change of the sensing signal includes the distorted of the wave, the change of the average value of the signal, the change of the peak value of the signal, the change of the current or the change of the voltage.

For example, when a user use a pen 112 with a magnetic sensing loop or a LC loop to touch the position 111, the magnetic flux, electromagnetic induction, current or frequency of the loop 107 and loop 108 is changed. Such change changes the sensing signal in the loop 107 and loop 108. When the sensor 105 senses this change of the sensing signal, the sensor can determine that the overlap region between the loop 107 and loop 108, position 111, is the touching position of the user.

On the other hand, when the capacitive touch sensing technology is performed by the dual-mode touch sensor 101, the sensor 105 sends a first control signal to the first selection line G1 to disconnect the connection between the first conductive lines 1011~101m and the first transmission line L1. The sensor 105 also sends a first control signal to the first selection line G1' to disconnect the connection between the second conductive lines 1021~102n and the first transmission line L1'. Typically, there are two types of the capacitive touch sensing technology. One is self-capacitance touch sensing technology. The other is Mutual-capacitance touch sensing technology.

According to the self-capacitance touch sensing technology, the sensor 105 senses the capacitance generated between the first conductive lines 1011-101m and the ground and between the second conductive lines 1021~102n and the ground to determine the touch position. Therefore, when a finger of a user touches a position, charges located in this position are moved from the first conductive lines 1011~101m or the second conductive lines 1021~102n to the finger of the user, which changes the capacitance in this position. In this case, the sensor 105 can sense this change of the capacitance in this position to determine the position. Accordingly, when the self-capacitance touch sensing technology is performed, the sensor 105 sends a second control signal to the second selection line G2 to disconnect the connection between the first conductive lines 1011~101m and the second transmission line L2. The sensor 105 also sends a second control signal to the second selection line G2' to disconnect the connection between the second conductive lines 1021~102n and the second transmission line L2'. Then, the sensor 105 sends a third control signal to the third second selection line G3 to select some of the first conductive lines 1011~101m to connect with the third transmission line L3. The sensor 105 also sends a third control signal to the third selection line G3' to select some of the second conductive lines 1021~102n to connect with the third transmission line L3'. Then, the sensor 105 sends a sensing signal to the selected first conductive lines through the third transmission line L3. The sensor 105 sends a sensing signal to the selected second conductive lines through the third transmission line L3'. Then, the sensor 105 can calculate the touching position based on the change of the capacitance.

On the other hand, according to the mutual-capacitance touch sensing technology, the sensor 105 senses the capacitance generated between the first conductive lines 1011~101m and the second conductive lines 1021~102n to determine the touch position. That is, the first conductive line and the second conductive line are the two electrodes of a capacitor. Therefore, when a finger of a user touches a position, charges located in this position are moved from the first conductive lines 1011~101m or the second conductive lines 1021~102n to the finger of the user, which changes the capacitance in this position. In this case, the sensor 105 can sense this change of the capacitance in this position to determine the position. Accordingly, when the mutual-capacitance touch sensing technology is performed to sense the touch position, the sensor 105 sends sensing signal to the first conductive lines 1011~101m through the second transmission line L2 and receives the sensing signal from the second conductive lines 1021~102n through the second transmission line L2' to determine the position whose capacitance is changed. Or, the sensor 105 sends sensing signal to the second conductive lines 1021~102n through the second transmission line L3' and receives the sensing signal from the first conductive lines 1011~101m through the second transmission line L2 to determine the position whose capacitance is changed. Then, the sensor 105 can calculate the touching position based on the change of the capacitance. It is noticed that the sensing method can also be applied to a resistance touch sensing technology, a pressure touch sensing technology, or an optical touch sensing technology.

Accordingly, the dual-mode touch sensor 100 of the present invention provides two types of sensing technology, the electromagnetic touch sensing technology and the capacitive touch sensing technology, to determine the touch position. In the electromagnetic touch sensing technology, a user can use a pen with a magnetic sensing loop or a LC loop to write. In the capacitive touch sensing technology, a user can use his finger to write. That is, the present invention provides different input interface to the user to increase the input convenience. When a user touches a panel using the dual-mode touch sensor 100 of the present invention, both electromagnetic touch sensing technology and capacitive touch sensing technology are used to determine the touch position, which increase the sensing accuracy. In another embodiment, a user also can select one of the electromagnetic touch sensing technology and the capacitive touch sensing technology to determine the touch position. When both the electromagnetic touch sensing technology and the capacitive touch sensing technology are used to determine the touch position, in an embodiment, the electromagnetic touch sensing technology is performed, then, the capacitive touch sensing technology is performed to determine the touch position, or, in another embodiment, the capacitive touch sensing technology is performed, then, the electromagnetic touch sensing technology is performed to determine the touch position.

Figure 2D:
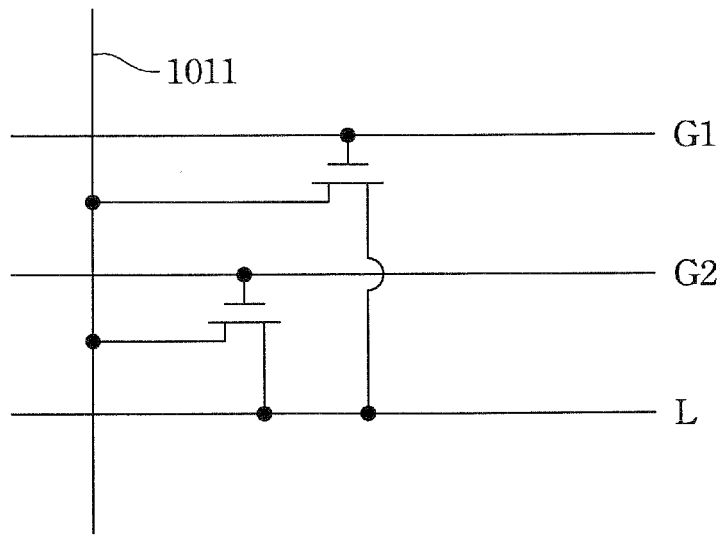
FIG. 2D illustrates a schematic diagram of a switch according to a preferred embodiment of the present invention.
Figure 2E:
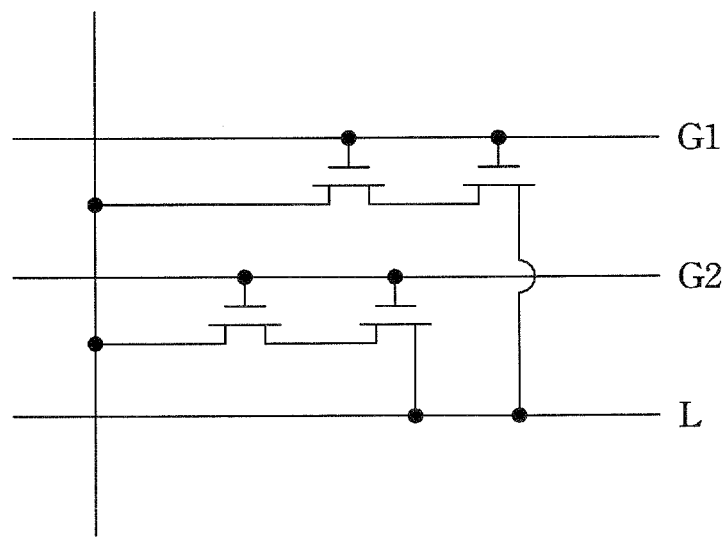
FIG. 2E illustrates a schematic diagram of a switch according to another preferred embodiment of the present invention.

Moreover, for preventing the switches broken because of frequently switching, two selection lines G1 and G2 are used to control two switches to make the connection between the first conductive lines or the second conductive lines and the transmission line L as illustrated in FIG. 2D. According to such structure, even though one of the two switches is broken, the other switch also can make the connection between the first conductive lines or the second conductive lines and the transmission line L. In another embodiment, the switches can have double-gate structure.

On the other hand, the electrode structure of a dual-mode touch sensor according to a preferred embodiment of the present invention can be integrated into the array electrode of a display panel. That is, the array electrode of a display panel can be used to serve as the electrode of the dual-mode touch sensor of the present invention.

Figure 3A:
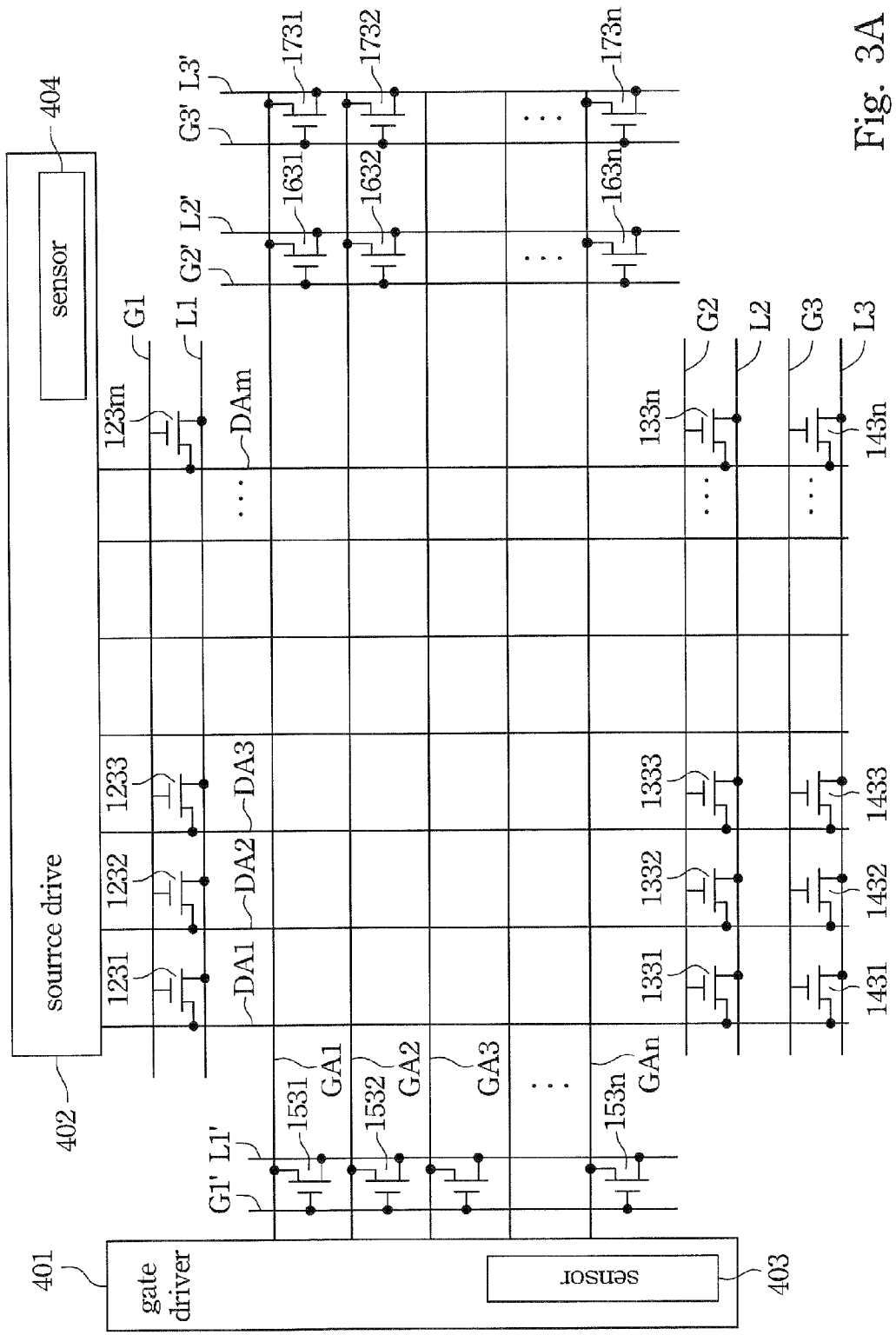
FIG. 3A illustrates a display array electrode structure of a display that is used to serve as a sensing electrode structure of a dual-mode touch sensor according to a preferred embodiment of the present invention.

FIG. 3A illustrate a display array electrode structure of a display that is used to serve as a sensing electrode structure of a dual-mode touch sensor according to a preferred embodiment of the present invention. The display panel is composed of a plurality of data lines DA1, DA2 . . . DAm and a plurality of scan lines GA1, GA2, . . . , GAn. The data lines cross the scan lines. Each pair of data lines and scan line controls a pixel unit. For example, the data line DA1 and the scan line GA1 controls a pixel. The gate driver 401 sends scan signal to scan scan lines GA1, GA2, . . . , GAn. The scan signal in the scan line may turn on the corresponding thin film transistor. Then, source driver transfers the image signal to the pixels through the data line DA1, DA2 . . . DAm to display image. Accordingly, it is not necessary to form additional electrodes for sensing the touch position. Therefore, the production cost is reduced and the production yield is kept.

In this embodiment, the data lines DA1, DA2 . . . DAm are the first conductive lines $1011$~$101m$. The scan lines GA1, GA2, . . . , GAn are the second conductive lines $1021$~$102n$. The sensor 403 is integrated into the gate driver 401 to sense the Y-direction position. The sensor 404 is integrated into the source driver 405 to sense the X-direction position. Accordingly, the sensor 404 sends a first control signal to the first selection line G1 to turn on all the switches $1231$~$123m$. In this embodiment, the switches $1231$~$123m$ are N-type thin film transistors. Therefore, the first control signal is in a high level state. When all the switches $1231$~$123m$ are turned on, the data lines DA1, DA2 . . . DAm are connected to the first transmission line L1 through the switches $1231$~$123m$. Next, the sensor 404 sends a second control signal to the second selection line G2 to turn on the switches $1331$~$133m$ to select the data lines DA1, DA2 . . . DAm connect with the second transmission line L2. The sensor 404 also sends a third control signal to the third selection line G3 to turn on the switches $1431$~$143m$ to select the data lines DA1, DA2 . . . DAm connect with the third transmission line L3.

On the other hand, the sensor 403 sends a first control signal to the first selection line G1 to turn on all the switches $1531$~$153n$. When all the switches $1531$~$153n$ are turned on, the scan lines GA1, GA2, . . . , GAn are connected to the first transmission line L1' through the switches $1531$~$153n$. Then, the sensor 403 sends a second control signal to the second selection line G2' to turn on the switches $1631$~$163n$ to select the scan lines GA1, GA2, . . . , GAn connect with the second transmission line L2'. The sensor 403 also sends a third control signal to the third selection line G3' to turn on the switches $1731$~$173n$ to select the scan lines GA1, GA2, . . . , GAn connect with the third transmission line L3'. The method to perform the electromagnetic touch sensing technology and the capacitive touch sensing technology in this embodiment is same as the above embodiment.

Figure 3B:
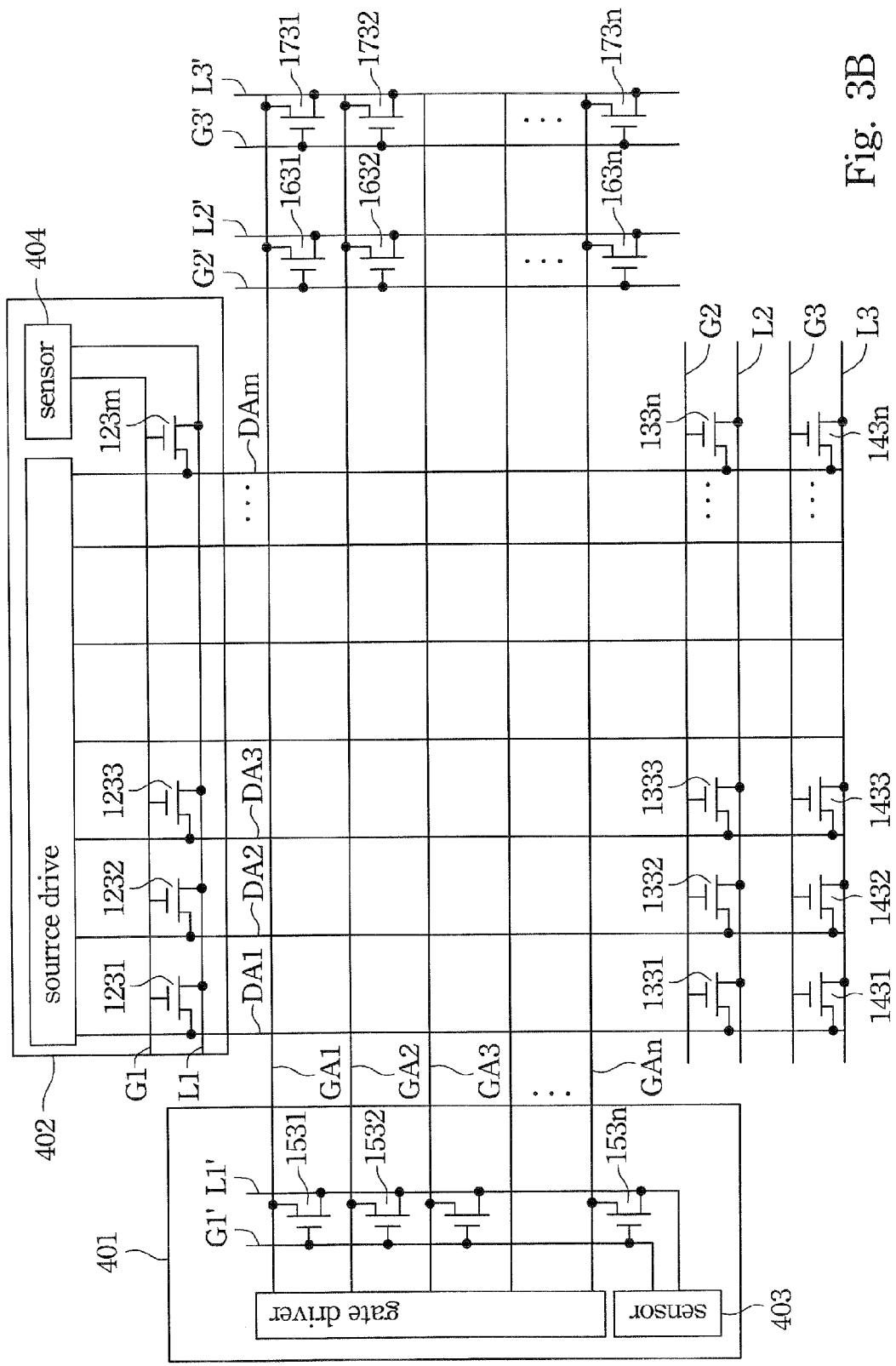
FIG. 3B illustrates a display array electrode structure of a display that is used to serve as a sensing electrode structure of a dual-mode touch sensor according to another preferred embodiment of the present invention.
Figure 3C:
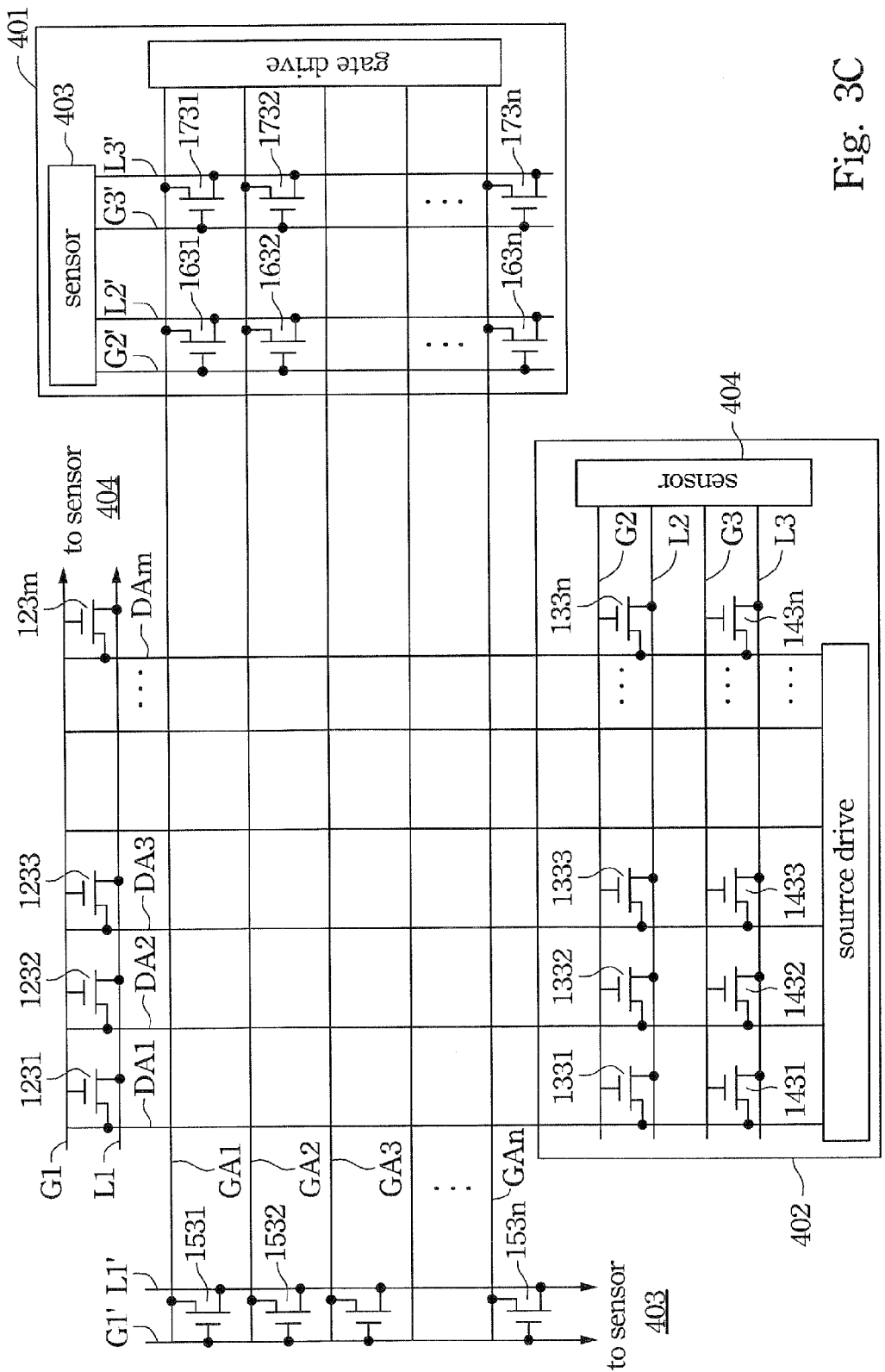
FIG. 3C illustrates a display array electrode structure of a display that is used to serve as a sensing electrode structure of a dual-mode touch sensor according to a further preferred embodiment of the present invention.

In an embodiment, the switches are thin film transistors (TFT) or other devices with the same function as the thin film transistors. When the switches are thin film transistors, the switches can be formed on the array substrate. In another embodiment, one or two of the three switch groups, the switches $1231$~$123m$, the switches $1331$~$133m$ and the switches $1431$~$143m$, can be integrated into the source driver 402. One or two of the three switch groups, the switches $1531$~$153n$, the switches $1631$~$163n$ and the switches $1731$~$173n$, can be integrated into the gate driver 401. As shown in FIG. 3B, the switches $1231$~$123m$ are integrated into the source driver 402. The switches $1531$~$153n$ is integrated into the gate driver 401.

Moreover, the display is an Organic Light Emitting Display, a thin film transistor liquid crystal display, an Electrode Wetting display or an electrophoretic display. The pixel array of this display is a transmissive-mode pixel array, a reflective-mode pixel array or a dual-mode transflective pixel array.

Figure 4:
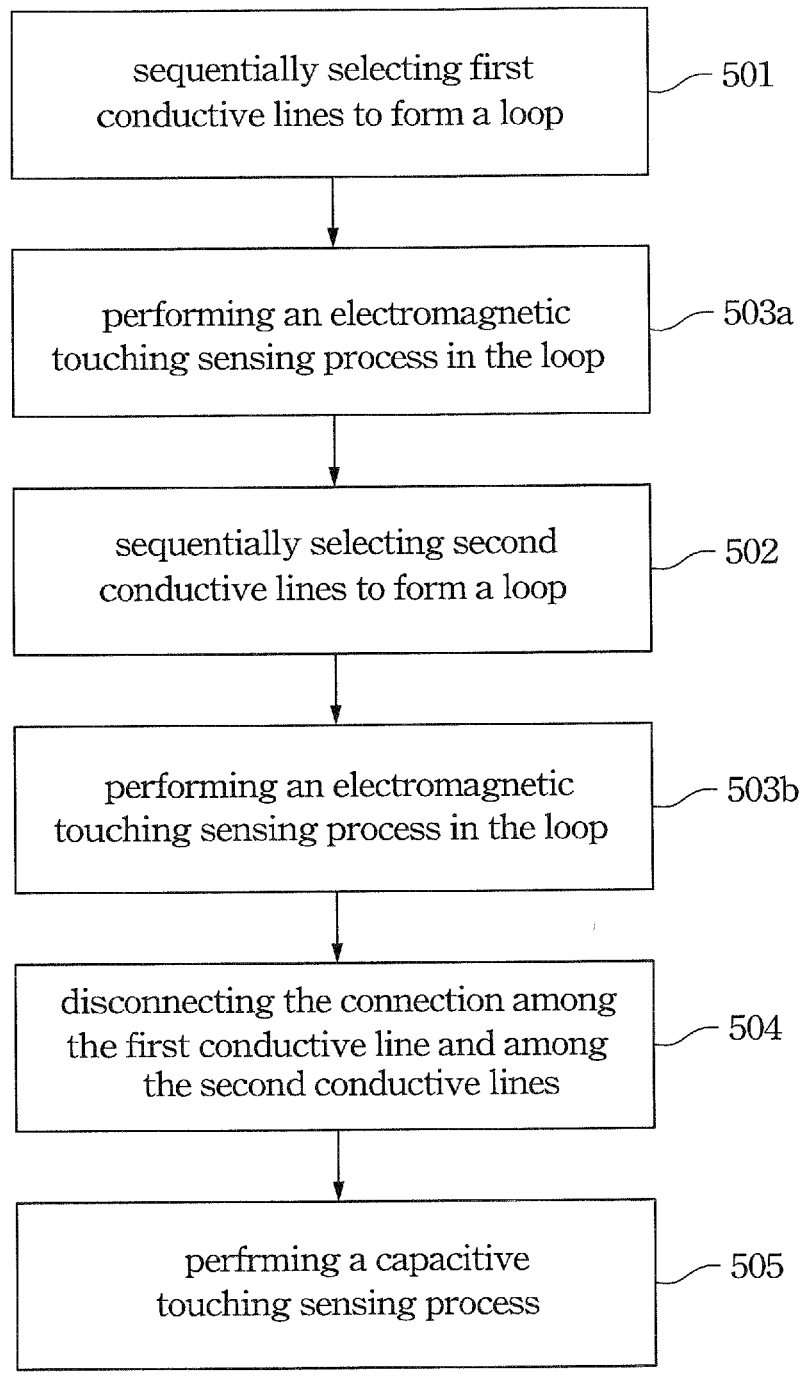
FIG. 4 illustrates a flow chart to describe the electromagnetic touch sensing technology is performed, then, the capacitive touch sensing technology is performed to determine the touch position.

FIG. 4 illustrate a flow chart to describe the electromagnetic touch sensing technology is performed, then, the capacitive touch sensing technology is performed to determine the touch position. Please refer to the FIG. 2A and FIG. 4.

In step 501, a control signal controls one end of each first conductive line to connect with a first transmission line. Another control signal selects the first conductive lines sequentially to connect with the second and third transmission lines to form loops. For example, the sensor 105 sends a first control signal to the first selection line G1 to turn on all the switches $1231$~$123m$. When all the switches $1231$~$123m$ are turned on, the first conductive lines $1011$~$101m$ are connected to the first transmission line L1 through the switches $1231$~$123m$. On the other hand, the sensor 105 sends a second control signal to the second selection line G2 to turn on the switches $1331$~$133m$ sequentially to connect the first conductive lines $1011$~$101m$ to the second transmission line L2. The sensor 105 also sends a third control signal to the second selection line G2 to turn on the switches $1431$~$143m$ sequentially to connect the first conductive lines $1011$~$101m$ to the second transmission line L3. Loops are formed in the first conductive lines.

Next in step 503a, the sensor checks the magnetic flux, electromagnetic induction, current or frequency of the loops to determine the touch position.

In Step 502, a control signal controls one end of each second conductive line to connect with a first transmission line. Another control signal selects the second conductive lines sequentially to connect with the second and third transmission lines to form loops. For example, the sensor 105 sends a first control signal to the first selection line G1' to turn on all the switches $1531$~$153n$. When all the switches $1531$~$153n$ are turned on, the second conductive lines $1021$~$102n$ are connected to the first transmission line L1' through the switches $1531$~$153n$. On the other hand, the sensor 105 sends a second control signal to the second selection line G2' to turn on the switches $1631$~$163n$ sequentially to connect the select conductive lines $1021$~$102n$ to the second transmission line L2'. The sensor 105 also sends a third control signal to the second selection line G2' to turn on the switches $1731$~$173n$ sequentially to connect the second conductive lines $1021$~$102n$ to the second transmission line L3'. Loops are formed in the second conductive lines.

Next in step 503b, the sensor checks the magnetic flux, electromagnetic induction, current or frequency of the loops to determine the touch position. For example, the sensor 105 sends sensing signal to the first conductive lines $1011$~$101m$ through the second transmission line L2 and receives the sensing signal from the third transmission line L3. The sensor 105 also sends sensing signal to the second conductive lines 1021~102n through the second transmission line L2' and receives the sensing signal from the third transmission line L3'. Accordingly, a touch position can be determined. In an embodiment, the sensor 105 can determine whether or not the magnetic flux, electromagnetic induction, current or frequency is changed based on the sensing signal whether or not is changed. In an embodiment, the sensing signal is a square wave signal, a triangle wave signal, a like-triangle wave signal or a wave signal composed of a plurality of square wave signals. The change of the sensing signal includes the distorted of the wave, the change of the average value of the signal, the change of the peak value of the signal, the change of the current or the change of the voltage.

Then, a capacitive touch sensing technology is performed. In step 504, the sensor disconnects the connection among the first conductive lines and disconnects the connection among the second conductive lines.

In step 505, the sensor determines the touch position based on the change of the capacitance. Typically, there are two types of the capacitive touch sensing technology. One is self-capacitance touch sensing technology. The other is Mutual-capacitance touch sensing technology. According to the self-capacitance touch sensing technology, the sensor 105 can sense this change of the capacitance in this position to determine the position. Accordingly when the self-capacitance touch sensing technology is performed, the sensor 105 sends a second control signal to the second selection line G2 to disconnect the connection between the first conductive lines 1011~101m and the second transmission line L2. The sensor 105 also sends a second control signal to the second selection line G2' to disconnect the connection between the second conductive lines 1021~102n and the second transmission line L2'. Then, the sensor 105 sends a third control signal to the third second selection line G3 to select some of the first conductive lines 1011~101m to connect with the third transmission line L3. The sensor 105 also sends a third control signal to the third selection line G3' to select some of the second conductive lines 1021~102n to connect with the third transmission line L3'. Then, the sensor 105 sends a sensing signal to the selected first conductive lines through the third transmission line L3. The sensor 105 sends a sensing signal to the selected second conductive lines through the third transmission line L3'. Then, the sensor 105 can calculate the touching position based on the change of the capacitance.

On the other hand, when the mutual-capacitance touch sensing technology is performed to sense the touch position, the sensor 105 sends sensing signal to the first conductive lines 1011~101m through the second transmission line L2 and receives the sensing signal from the second conductive lines 1021~102n through the second transmission line L2' to determine the position whose capacitance is changed. Or, the sensor 105 sends sensing signal to the second conductive lines 1021~102n through the second transmission line L3' and receives the sensing signal from the first conductive lines 1011~101m through the second transmission line L2 to determine the position whose capacitance is changed. Then, the sensor 105 can calculate the touching position based on the change of the capacitance.

On the other hand, the touch sensor of the present invention further can be integrated into an image gathering device, such as a CCD image gathering device, a CMOS image gathering device, an optical sensing device or an X-ray sensing device. The image gathering device can gather an image, a gesture or a facial expression. The image gathering device can analyze the gathered image, gesture or facial expression and give a response.

On the other hand, the touch sensing electrode structure of the touch sensor of the present invention further can be integrated into an array of an image gathering device, such as a CCD image gathering device, a CMOS image gathering device, an optical sensing device or an X-ray sensing device. That is, the array of an image gathering device serves as the electrode structure of the touch sensor of the present invention. The array of the image gathering device can gather an image or a gesture. Moreover, the array that serves as the touch sensing electrode structure can determine the position or height of the image or the gesture to perform a further application or to build a relation or to give a response.

Accordingly, comparing with a conventional image gathering device and touch sensor, the image gathering device with a touch sensor of the present invention can support more application. For example, according to the gathered images or gestures and the corresponding sensed position of the gathered images or gestures by the image gathering device with a touch sensor, different gathered images or gestures can trigger different applications even though the gathered images or gestures have same sensed position. In an embodiment, if a sensed position can trigger an application to play music and images, according to a conventional touch sensor, an additional touch step needs to be performed to select to play music or images after the application is triggered. However, according to the image gathering device with a touch sensor of the present invention, a user can use different gestures to directly trigger the application and select to play music or images, which can save a selection step.

Figure 5:
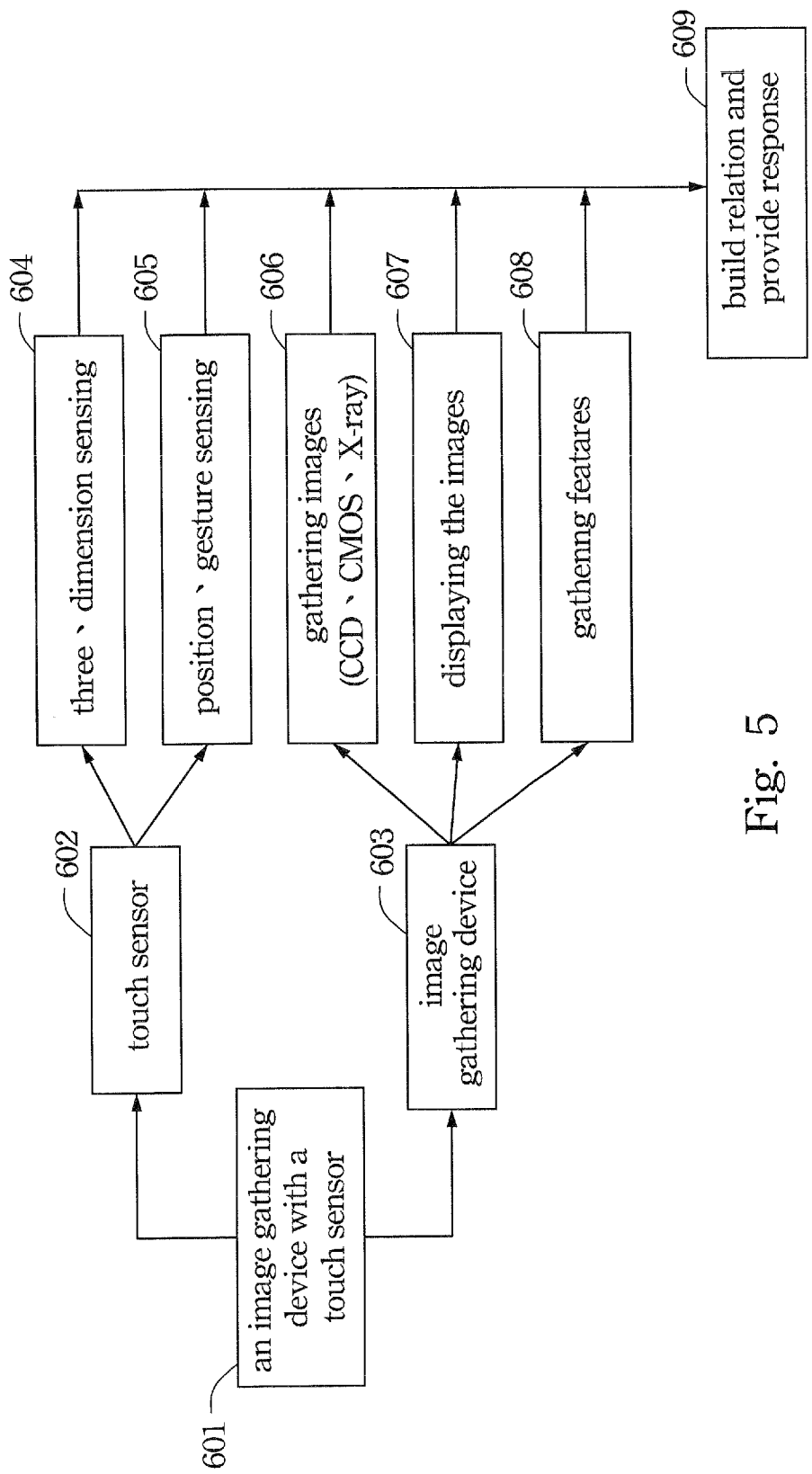
FIG. 5 illustrates a flow chart to describe the operation of the dual-mode touch sensor of the present invention that is integrated into an array for gathering image.

FIG. 5 illustrates a flow chart to describe the operation of the dual-mode touch sensor of the present invention that is integrated into an array for gathering image.

In step 601, when a user approaches the image gathering device with a touch sensor of the present invention, the touch sensor 602 senses the position and the image gathering device 603, such as a CCD image gathering device, a CMOS image gathering device, an optical sensing device or an X-ray sensing device, gathers an image. In an embodiment, the touch sensor 602 can perform a three-dimension sensing in step 604 and a position or gestures sensing in step 605. The image gathering device 603 can gather images in step 606. Then, in step 607, the gathered images are displayed in a display. In another embodiment, the image gathering device 603 can gather gestures, actions or a facial expression in step 608. Then, in step 609, the image gathering device 603 can give a response according to the gathered gestures, actions or a facial expression. Before the image gathering device 603 gives a response, the gathered data is compared and processed to build a relation for further processing.

The further processing includes to encode or discoed the gathered data, to calculate or compare the gathered data, to transfer the gathered data, to display the gathered data or images, or to compare the images. The gesture relation or response includes numbers, characters, accomplished. OK, stop, a crash, death, column. The gesture relation or response further includes good, bad, coming, go. The facial expression relation or response further includes crying, laughing, angry, sad.

Accordingly, the dual-mode touch sensor of the present invention uses control signals to select sensing electrode. Therefore, the hardware cost is reduced. Moreover, in an embodiment, the claimed invention provides two types of sensing technology, the electromagnetic touch sensing technology and the capacitive touch sensing technology, to determine the touch position. In the electromagnetic touch sensing technology, a user can use a pen with a magnetic sensing loop or a LC loop to write. In the capacitive touch sensing technology, a user can use his finger to write. That is, the present invention provides different input interface to the user to increase the input convenience. Moreover, the data line the scan lines, the power lines, the Bias lines, the common electrode lines, the reading lines and the control lines of the display can be used to serve as the electrode of the dual-mode touch sensor of the present invention. Accordingly, it is not necessary to form additional electrodes for sensing the touch position. Therefore, the production cost is reduced and the production yield is kept.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A dual-mode touch sensing apparatus, comprising:
    a sensor;
        a plurality of first conductive line, a first direction selection line, and a first direction transmission line arranged in parallel to each other and in a first direction, wherein the first direction selection line corresponds to the first direction transmission line; and
        a plurality of second conductive line, a second direction selection line, and a second direction transmission line arranged in parallel to each other and in a second direction, wherein the second conductive lines cross the first conductive lines, the first direction selection line and the first direction transmission line, and the first conductive lines cross the second conductive lines, the second direction selection line, and the second direction transmission line;
        wherein the sensor transfers a control signal to the first direction selection line to switch the connection between the second conductive lines and the first direction transmission line, and transfers a control signal to the second direction selection line to switch the connection between the first conductive lines and the second direction transmission line.

2. The dual-mode touch sensing apparatus of claim 1, wherein the first direction selection line further includes a first direction first selection line, a first direction second selection line and a first direction third selection line,
    the first direction transmission line further includes a first direction first transmission line, a first direction second transmission line and a first direction third transmission line,
    the second direction selection line further includes a second direction first selection line, a second direction second selection line and a second direction third selection line,
    the second direction transmission line further includes a second direction first transmission line, a second direction second transmission line and a second direction third transmission line.

3. The dual-mode touch sensing apparatus of claim 2, wherein when the dual-mode touch sensing apparatus performs an electromagnetic touch sensing technology,
    the sensor transfers a first control signal to the first direction first selection line to make the second conductive lines connect with the first direction first transmission line together,
    the sensor transfers a second control signal to the first direction second selection line to make the second conductive lines sequentially connect with the first direction second transmission line,
    the sensor transfers a third control signal to the first direction third selection line to make the second conductive lines sequentially connect with the first direction third transmission line, wherein the third control signal is behind the second control signal,
    the sensor transfers a fourth control signal to the second direction first selection line to make the first conductive lines connect with the second direction first transmission line together,
    the sensor transfers a fifth control signal to the second direction second selection line to make the first conductive lines sequentially connect with the second direction second transmission line,
    the sensor transfers a sixth control signal to the second direction third selection line to make the first conductive lines connect with the second direction third transmission line, wherein the sixth control signal is behind the fifth control signal, and
    the sensor performs a first sensing method to sense the magnetic flux, electromagnetic induction, current or frequency of loops to determine a touch position.

4. The dual-mode touch sensing apparatus of claim 3, wherein the second control signal and the third control signal are first square wave signals, and the fifth control signal and the sixth control signal are second square wave signals.

5. The dual-mode touch sensing apparatus of claim 4, further comprising a plurality of switches located in the positions of the second conductive lines crossing the first direction first selection line, the first direction second selection line and the first direction third selection line, and located in the positions of the first conductive lines crossing the second direction first selection line, the second direction second selection line and the second direction third selection line.

6. The dual-mode touch sensing apparatus of claim 4, further comprising to form a loop in the second direction, comprising:
    the first control signal turns on the switches located in the positions of the second conductive lines crossing the first direction first selection line to make the second conductive lines to connect with the first direction first transmission line together,
    the second control signal turns on at least one of the switches located in the positions of the second conductive lines crossing the first direction second selection line to make the at least one of the second conductive lines to connect with the first direction second transmission line,
    the third control signal turns on at least one of the switches located in the positions of the second conductive lines crossing the first direction third selection line to make at least one of the second conductive lines to connect with the first direction third transmission line, and
    to form a loop in the first direction, comprising:
    the fourth control signal turns on the switches located in the positions of the first conductive lines crossing the second direction first selection line to make the first conductive lines to connect with the second direction first transmission line together,
    the fifth control signal turns on at least one of the switches located in the positions of the first conductive lines crossing the second direction second selection line to make the at least one of the first conductive lines to connect with the second direction second transmission line, the sixth control signal turns on at least one of the switches located in the positions of the first conductive lines crossing the second direction third selection line to make at least one of the first conductive lines to connect with the second direction third transmission line, the sensor performs the first sensing method to sense the magnetic flux, electromagnetic induction, current or frequency of loops to determine a touch position.

7. The dual-mode touch sensing apparatus of claim 6, wherein the first sensing method is to transfer a sensing signal with a special frequency to the sensing loops to sense the magnetic flux, electromagnetic induction, current or frequency of the sensing loops, wherein the sensor determine whether or not the magnetic flux, electromagnetic induction, current or frequency of the sensing loops are changed.

8. The dual-mode touch sensing apparatus of claim 2, wherein when the dual-mode touch sensing apparatus performs an capacitive touch sensing technology, the sensor transfers a first control signal to the first direction first selection line to disconnect the second conductive lines with the first direction first transmission line, the sensor transfers a second control signal to the first direction second selection line to make the second conductive lines sequentially connect with the first direction second transmission line, the sensor transfers a third control signal to the first direction third selection line to disconnect the second conductive lines with the first direction third transmission line, the sensor transfers a fourth control signal to the second direction first selection line to disconnect the first conductive lines with the second direction first transmission line together, the sensor transfers a fifth control signal to the second direction second selection line to make the first conductive lines sequentially connect with the second direction second transmission line, the sensor transfers a sixth control signal to the second direction third selection line to disconnect the first conductive lines with the second direction third transmission line, and the sensor performs a second sensing method to sense the change of the capacitance, current or voltage of the first conductive lines and the second conductive lines to determine a touch position.

9. The dual-mode touch sensing apparatus of claim 8, wherein the second sensing method is the sensor transfers a sensing signal through the first direction second transmission line to the second conductive lines, and transfers a sensing signal through the second direction second transmission line to the first conductive lines to sense the change of the capacitance, current or voltage of the first conductive lines and the second conductive lines to determine a touch position.

10. The dual-mode touch sensing apparatus of claim 1, wherein the first direction selection line further includes a first direction first selection line, the first direction transmission line includes a first direction first transmission line, the second direction selection line further includes a second direction first selection line, and the second direction transmission line further includes a second direction first transmission line.

11. The dual-mode touch sensing apparatus of claim 10, wherein when the dual-mode touch sensing apparatus performs an capacitive touch sensing technology, the sensor transfers a control signal to the first direction first selection line to make the second conductive lines connect with the first direction first transmission line sequentially, and the sensor transfers a control signal to the second direction first selection line to make the first conductive lines sequentially connect with the second direction first transmission line sequentially, the sensor performs a sensing method to sense the magnetic flux, electromagnetic induction, current or frequency of loops to determine a touch position.

12. The dual-mode touch sensing apparatus of claim 11, wherein the sensing method is the sensor transfers a exciting signal through the first direction first transmission line to the second conductive lines, and sequentially detects each of the first conductive lines through the second direction first transmission line to sense the change of the capacitance, current or voltage of the first conductive lines and the second conductive lines to determine a touch position.

13. The dual-mode touch sensing apparatus of claim 1, wherein the first conductive lines and the second conductive lines includes the data lines, the scan lines, the power lines, the Bias lines, the common electrode lines, the reading lines and the control lines of a display.

14. The dual-mode touch sensing apparatus of claim 1, wherein the sensor is integrated into a gate driver of a display or integrated into a source driver of a display.

15. The dual-mode touch sensing apparatus of claim 14, wherein the display is an Organic Light Emitting Display, a thin film transistor liquid crystal display, an Electrode Wetting display or an electrophoretic display.

16. An image gathering apparatus, comprising:

an array for gathering images, wherein the array is a CCD array, a CMOS array, an X-ray sensing array or an optical device array; and a dual-mode touch sensing apparatus coupling with the array, further comprising:

a sensor;

a plurality of first conductive line, a first direction selection line, and a first direction transmission line arranged in parallel to each other and in a first direction, wherein the first direction selection line corresponds to the first direction transmission line; and a plurality of second conductive line, a second direction selection line, and a second direction transmission line arranged in parallel to each other and in a second direction, wherein the second conductive lines cross the first conductive lines, the first direction selection line and the first direction transmission line, and the first conductive lines cross the second conductive lines, the second direction selection line, and the second direction transmission line;

wherein the sensor transfers a control signal to the first direction selection line to switch the connection between the second conductive lines and the first direction transmission line, and transfers a control signal to the second direction selection line to switch the connection between the first conductive lines and the second direction transmission line.

17. The image gathering apparatus of claim 16, wherein the first conductive lines and the second conductive lines includes the data lines, the scan lines, the power lines, the Bias lines, the common electrode lines, the reading lines and the control lines of the array.

18. The image gathering apparatus of claim 16, wherein the array gather a first information including an image, a gesture or a facial expression, and the dual-mode touch sensing apparatus senses a second information including a position, a height or an action.

19. The image gathering apparatus of claim 18, further comprising to build a relation and give a response based on the first information and the second first information.

20. The image gathering apparatus of claim 19, wherein the relation and the response includes numbers, characters, accomplished, OK, stop, a crash, or death, crying, laughing, angry, sad, to encode or discoed the gathered data, to calculate or compare the gathered data, to transfer the gathered data, to display the gathered data or images, or to compare the images.

* * * * *